(12) United States Patent
Hobbs et al.

(10) Patent No.: US 7,368,930 B2
(45) Date of Patent: May 6, 2008

(54) ADJUSTMENT MECHANISM

(75) Inventors: Eric D. Hobbs, Livermore, CA (US);
Christopher D. McCoy, Dublin, CA (US); James M. Porter, Jr., Oakland, CA (US); Alexander H. Slocum, Bow, NH (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/464,593

(22) Filed: Aug. 15, 2006

(65) Prior Publication Data
US 2008/0036480 A1 Feb. 14, 2008

Related U.S. Application Data

(60) Provisional application No. 60/821,471, filed on Aug. 4, 2006.

(51) Int. Cl.
*G01R 31/02* (2006.01)
(52) U.S. Cl. .................................. 324/758; 324/754
(58) Field of Classification Search ..................... None
See application file for complete search history.

(56) References Cited

U.S. PATENT DOCUMENTS

| | | | | |
|---|---|---|---|---|
| 5,828,225 | A * | 10/1998 | Obikane et al. ............ 324/758 |
| 6,078,186 | A * | 6/2000 | Hembree et al. ........... 324/755 |
| 6,509,751 | B1 * | 1/2003 | Mathieu et al. ............. 324/754 |
| 6,586,956 | B2 * | 7/2003 | Aldaz et al. ................ 324/758 |
| 6,677,771 | B2 * | 1/2004 | Zhou et al. ................. 324/758 |
| 6,774,651 | B1 * | 8/2004 | Hembree ..................... 324/758 |
| 6,784,678 | B2 * | 8/2004 | Pietzschmann ............. 324/758 |
| 7,071,715 | B2 * | 7/2006 | Shinde et al. ............... 324/754 |
| 7,074,072 | B2 * | 7/2006 | Huebner ..................... 439/482 |
| 7,075,319 | B2 * | 7/2006 | Mori ........................... 324/754 |
| 7,255,575 | B2 * | 8/2007 | Hasegawa ..................... 439/71 |
| 7,262,611 | B2 * | 8/2007 | Mathieu et al. ............. 324/754 |
| 2004/0061515 | A1 * | 4/2004 | Chang et al. ................ 324/755 |
| 2004/0113643 | A1 * | 6/2004 | Kawaguchi et al. ........ 324/754 |
| 2004/0266089 | A1 | 12/2004 | Mathieu et al. |

OTHER PUBLICATIONS

U.S. Appl. No. 09/527,931, filed Mar. 17, 2000, Mathieu et al.

* cited by examiner

*Primary Examiner*—Ha Tran Nguyen
*Assistant Examiner*—Richard Isla-Rodas
(74) *Attorney, Agent, or Firm*—N. Kenneth Burraston

(57) ABSTRACT

A probe card assembly can comprise a support structure to which a plurality of probes can be directly or indirectly attached. The probes can be disposed to contact an electronic device to be tested. The probe card assembly can further comprise actuators, which can be configured to change selectively an attitude of the support structure with respect to a reference structure. The probe card assembly can also comprise a plurality of lockable compliant structures. While unlocked, the lockable compliant structures can allow the support structure to move with respect to the reference structure. While locked, however, the compliant structures can provide mechanical resistance to movement of the support structure with respect to the reference structure.

38 Claims, 17 Drawing Sheets

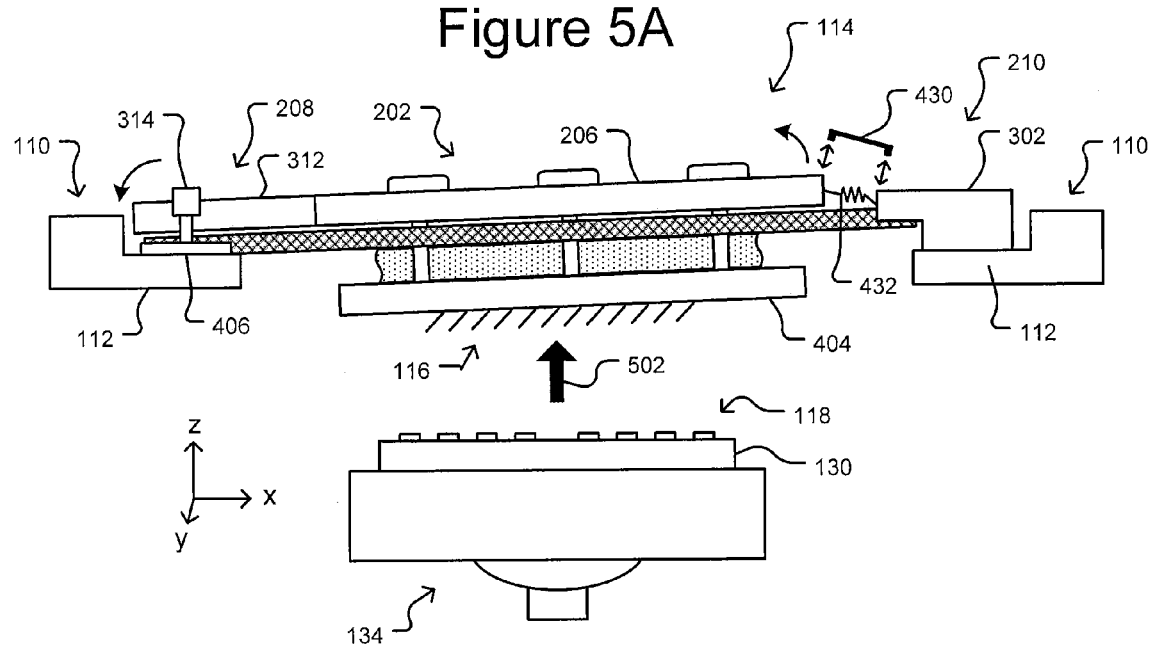
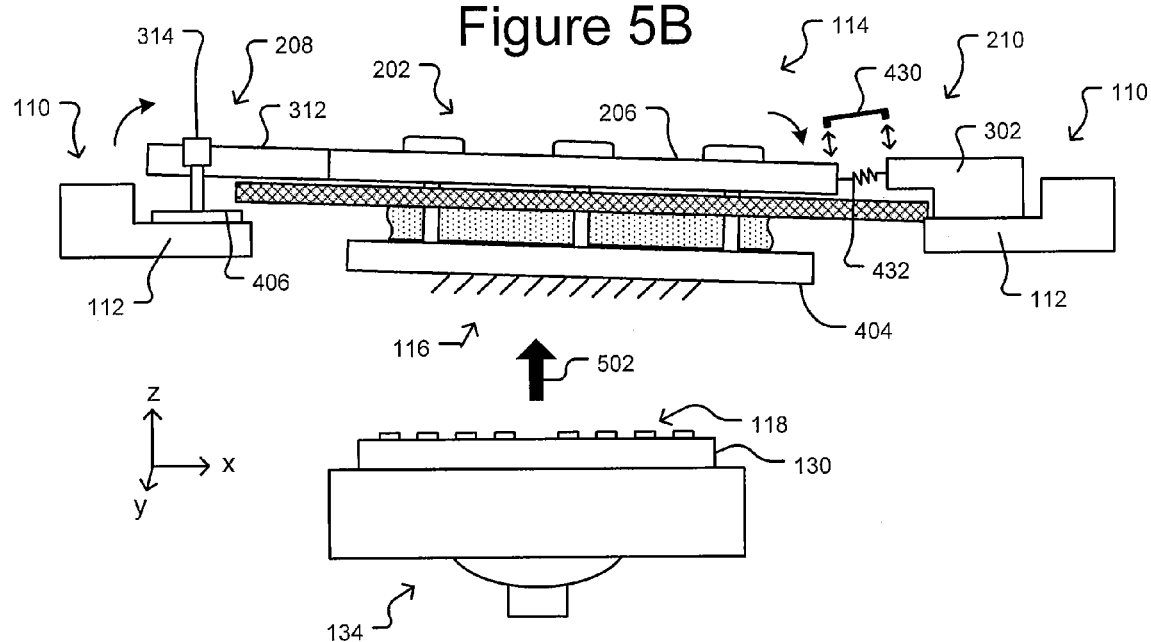

ADJUSTMENT MECHANISM

CROSS-REFERENCE TO RELATED APPLICATION

This application claims the benefit of U.S. Provisional Patent Application Ser. No. 60/821,471, filed Aug. 4, 2006.

BACKGROUND

Test systems for testing electronic devices, such as semiconductor dies, are known. In some such test systems, electrically conductive probes are brought into contact with terminals of the electronic devices. Power and test signals are then provided to the electronic devices through the probes, and the responses of the electronic devices to the test signals are monitored through the probes. To establish reliable electrical connections between the probes and the terminals of the electronic devices, the probes typically must be generally aligned with the terminals. In some test scenarios, aligning the probes with the terminals includes adjusting an attitude (e.g., tilt, orientation, planarity, etc.) of the contact tips of the probes to correspond generally with an attitude of the terminals. Moreover, in some test scenarios, thermal gradients, mechanical loads placed on the probes, and other such causes can cause undesired movement of the probes. In some instances, these movements can cause the probes to become so misaligned with the terminals that electrical connections between some or all of the probes and some or all of the terminals of the electronic devices are lost during testing of the electronic devices. Embodiments of the present invention are directed to improvements in adjusting an attitude of a probe card assembly and providing mechanical stiffening of the probe card assembly.

SUMMARY

A probe card assembly according to some embodiments of the invention, can comprise a support structure to which a plurality of probes can be directly or indirectly attached. The probes can be disposed to contact an electronic device to be tested. The probe card assembly can further comprise actuators, which can be configured to change selectively an attitude of the support structure with respect to a reference structure. The probe card assembly can also comprise a plurality of lockable compliant structures. While unlocked, the lockable compliant structures can allow the support structure to move with respect to the reference structure. While locked, however, the compliant structures can provide mechanical resistance to movement of the support structure with respect to the reference structure.

A method of selectively adjusting an attitude of a plurality of probes with respect to terminals of an electronic device to be tested, according to some embodiments of the invention, can comprise attaching a probe card assembly to a reference structure. The probes can be attached directly or indirectly to a support structure of the probe card assembly, which can comprise a plurality of lockable compliant structures. The method can further comprise changing an attitude of the support structure of the probe card assembly with respect to the reference structure while the lockable compliant structures are unlocked and then locking the lockable compliant structures. While unlocked, the lockable compliant structures can allow the support structure to move with respect to the reference structure. On the other hand, while locked, each lockable compliant structure can mechanically resist movement of the compliant structure with respect to the reference structure.

An apparatus for adjusting an attitude of a plurality of probes can, according to some embodiments of the invention, comprise an adjustment mechanism configured to adjust an attitude of a support structure with respect to a reference structure. The probes can be attached directly or indirectly to the support structure. The apparatus can further comprise a clutched compliant mechanism. While a clutch of the compliant mechanism is disengaged, the compliant mechanism can allow the support structure to move with respect to the reference structure. While the clutch is engaged, however, the compliant mechanism can mechanically resist movement of the support structure with respect to the reference structure.

In some embodiments, a tool holding assembly can comprise a support structure, and a plurality of tools can be secured directly or indirectly to the support structure and disposed to operate on a work piece. Actuators can be configured to change selectively an attitude of the support structure with respect to a reference structure. The tool holding assembly can include a plurality of lockable compliant structures. While unlocked, the lockable compliant structures can allow the support structure to move with respect to the reference structure. While locked, however, the compliant structures can mechanically resist movement of the support structure with respect to the reference structure.

BRIEF DESCRIPTION OF THE DRAWINGS

FIGS. 5A and 5B illustrate exemplary adjustment of the attitude of the probe card assembly of FIG. 2 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion. In addition, as the terms "on" and "attached to" and similar terms are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, horizontal, vertical, "x," "y," "z," etc.), if provided, are relative and provided solely by way of example and for ease of illustration and discussion and not by way of limitation.

Figure 1:
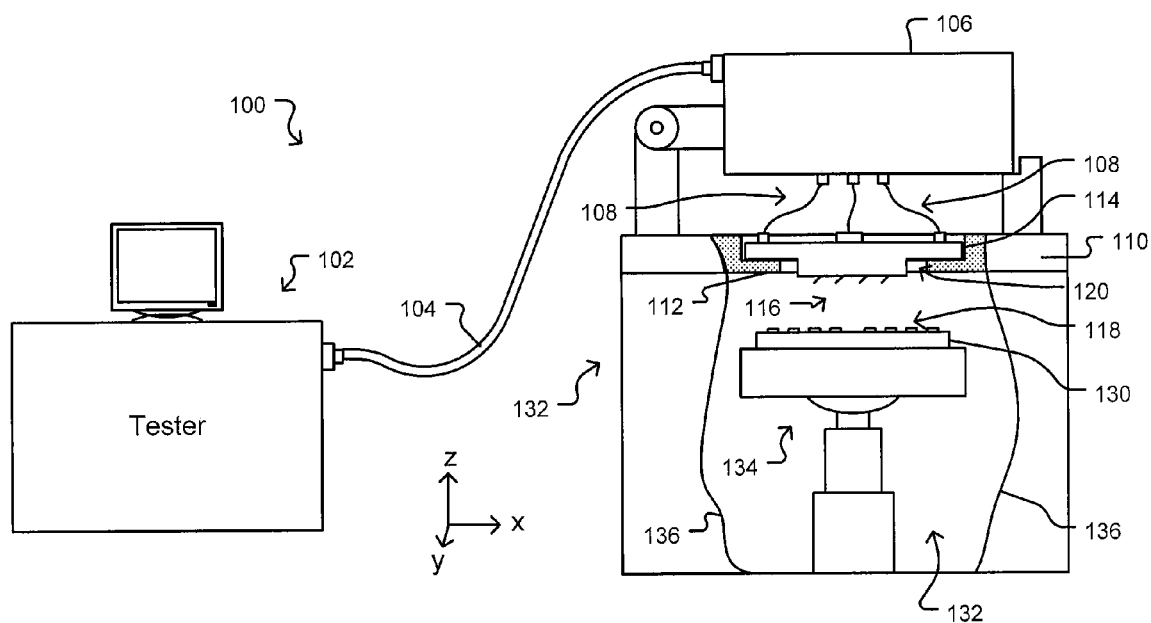
FIG. 1 illustrates an exemplary test system according to some embodiments of the invention.

FIG. 1 illustrates an exemplary test system 100 according to some embodiments of the invention. As shown, the test system 100 includes a housing 132 (e.g., a test apparatus, such as a semiconductor prober), which is shown in FIG. 1 with cutout 136 revealing an interior chamber 132 of the housing 132. As shown, a moveable chuck 134 can be located in the chamber 132 and configured to hold one or more electronic devices or DUTs 130 to be tested. As used herein, the acronym "DUT," which can refer to device or devices under test, refers to any electronic device or devices to be tested or being tested. Non-limiting examples of DUTs include one or more dies of an unsingulated semiconductor wafer, one or more semiconductor dies singulated from a wafer (packaged or unpackaged), one or more dies of a plurality of singulated semiconductor dies disposed in a carrier or other holding device, one or more multi-die electronics modules, one or more printed circuit boards, and any other type of electronic device or devices.

Figure 2:
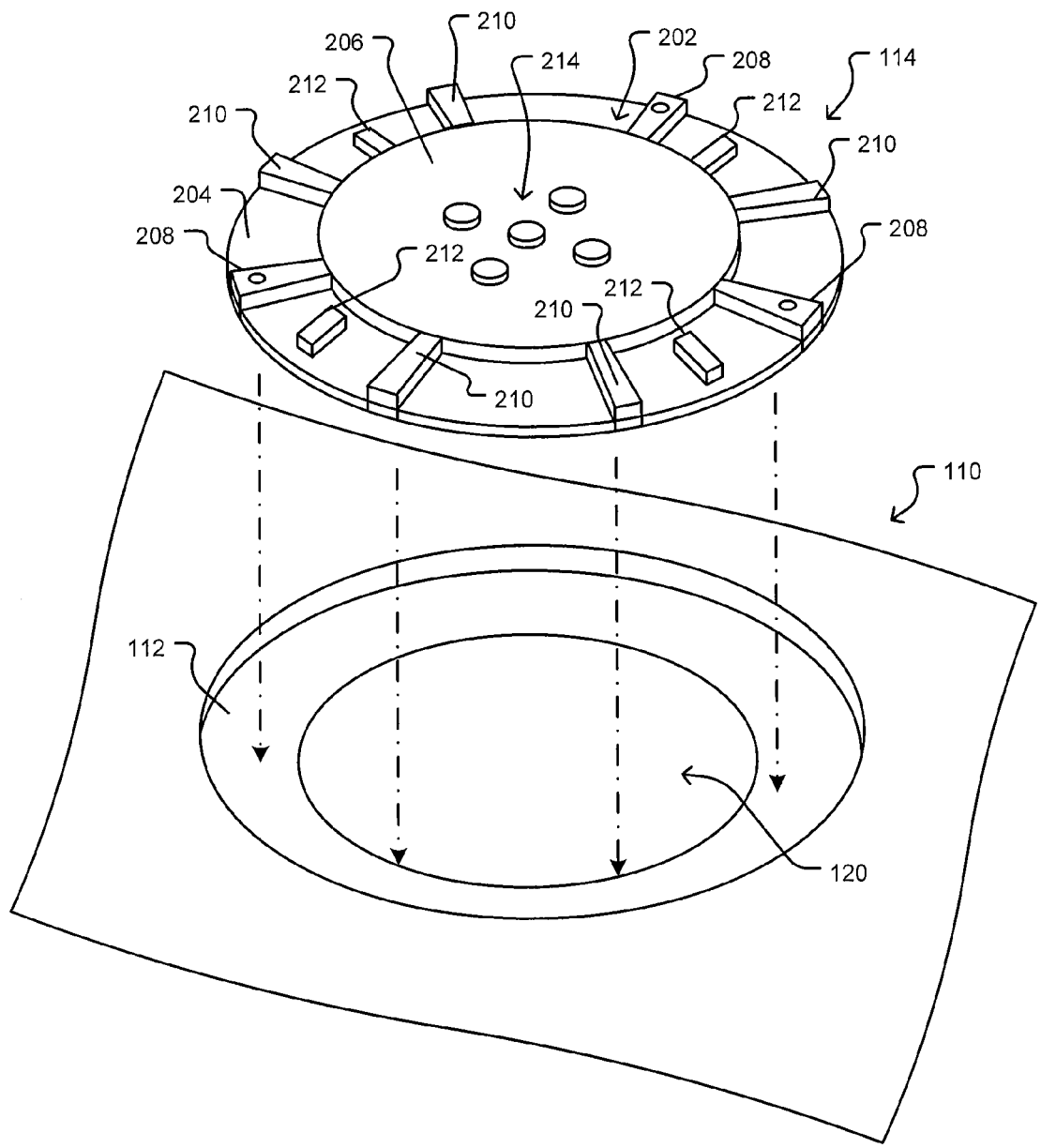
FIG. 2 illustrates a perspective view of an exemplary probe card assembly and a partial view of an exemplary head plate and insert ring according to some embodiments of the invention.

As shown, the housing 132 can comprise a head plate 110, which can, for example, be any rigid structure and can form part or all of an upper portion of the housing 132. A probe card assembly 114 comprising a plurality of electrically conductive probes 116 configured to contact input and/or output terminals 118 of the DUT 130 can be attached to the head plate 110. The probes 116 can be disposed, for example, in an array or other patterns. For example, the probes 116 can comprise contact tips configured to contact terminals 118 of the DUT 130. As best seen in FIG. 2, the head plate 110 can comprise an insert ring 112 (e.g., a card holder) or similar structure to which the probe card assembly 114 can be attached (e.g., bolted, clamped, etc.). The insert ring 112 can include an opening 120 through which the probes 116 can extend into the chamber 132.

As also shown in FIG. 1, the test system 100 can include a tester 102, which can be a computer or a computer system. A plurality of communications channels can be provided from the tester 102 to the probe card assembly 114. The communications channels can comprise any element or elements, device or devices, etc. that can provide communication links between the tester 102 and the probe card assembly 114 for the passage of power and signals (e.g., test signals, control signals, etc.) from the tester to the probe card assembly 114 and the passage of signals generated by the DUT 130 from the probe card assembly 114 to the tester 102.

In the example shown in FIG. 1, the communications channels can be formed by one or more communications links 104 (e.g., coaxial cables, fiber optic cables, wireless communications links, etc.) and electronics (e.g., receiver circuits, driver circuits, interface circuits, etc.) in a test head 106. The probe card assembly 114 can be electrically connected to the communications channels by electrical connectors 108, and the probe card assembly 114 can comprise electrically conductive paths between the connectors 108 and the probes 116. A plurality of electrically conductive paths can thus be provided between the tester 102 and the probes 116.

In operation, a DUT 130 can be placed on the chuck 134. The chuck 134 can then be moved such that ones of the input and/or output terminals 118 of the DUT 130 can be brought into contact with contact tips of ones of the probes 116, thereby establishing temporary electrical connections between the ones of the terminals 118 and the ones of the probes 116. The tester 102 can then generate power and test signals that are provided through the communications channels (e.g., comprising the link 104, circuitry in the tester head 106, and connectors 108) and the probe card assembly 114 to the DUT 130. Response signals generated by the DUT 130 in response to the test signals can be provided through the probe card assembly 114 and communications channels to the tester 102, which can analyze the response signals and determine whether the DUT 130 responded correctly to the test signals. For example, the tester 102 can compare the response signals to expected response signals.

In some embodiments, there may be fewer probes 116 than terminals 118. In such a case, the chuck 134 can move the DUT 130 such that other terminals 118 are brought into contact with ones of the probes 116 at which time the tester 102 can provide power and test signals through the communications channels and probe card assembly 114 to test other portions of the DUT 130. The foregoing process of bringing ones of the terminals 118 into contact with ones of the DUT terminals 118 and then testing a portion of the DUT 130 by providing power and test signals from the tester 102 to the DUT 130 and analyzing response signals generated by the DUT 130 in response to the test signals can be repeated as needed to test the entire DUT 130. For example, if DUT 130 is a semiconductor wafer comprising a plurality of semiconductor dies (not shown), the wafer can be repositioned multiple times, as needed, in order to test all of the dies of the wafer.

Test system 100 is exemplary only, and many modifications and changes are possible. For example, communications channels between the tester 102 and the probe card assembly 114 can be provided by means other than the link 104, test head 106, and connectors 108 shown in FIG. 1. For example, communication channels can be provided by direct communications links (e.g., coaxial cables, wireless communications links, fiber optic cables, etc.) directly connecting the tester 102 and the probe card assembly 110.

Figure 3:
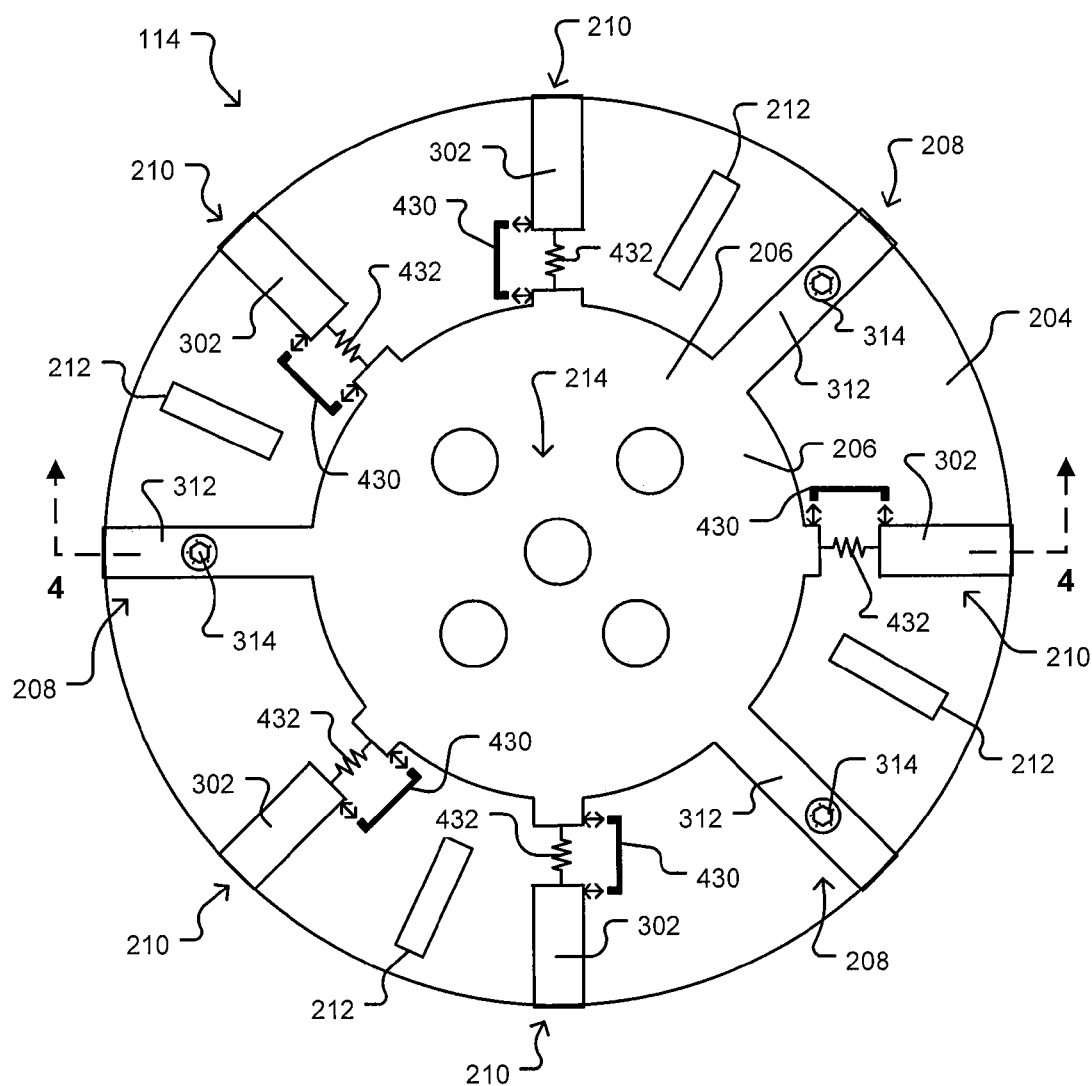
FIG. 3 illustrates a top view of the exemplary probe card assembly of FIG. 2.
Figure 4:
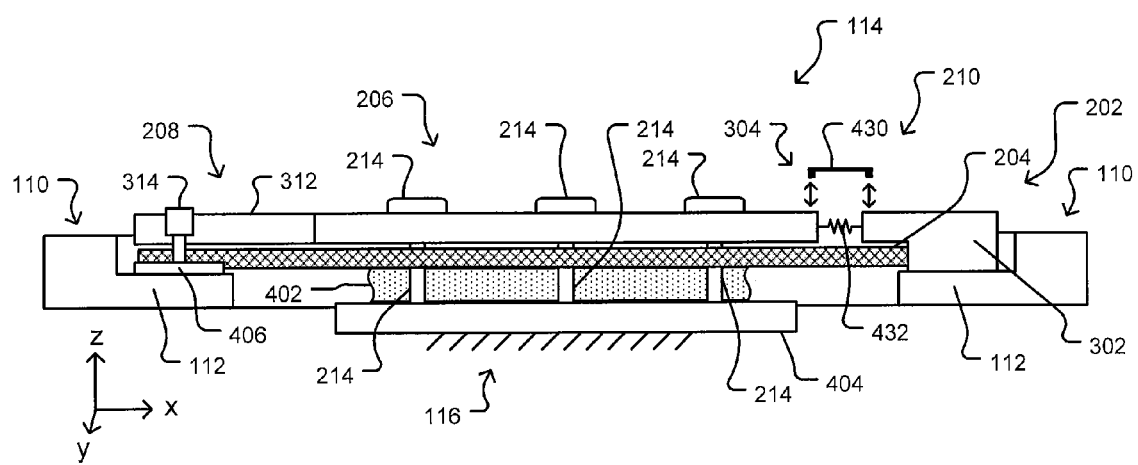
FIG. 4 illustrates a side view of the exemplary probe card assembly of FIG. 2.

FIGS. 2-4 illustrate in simplified block diagram form an exemplary configuration of the probe card assembly 114 according to some embodiments of the invention. FIGS. 2-4 also show a partial view of the head plate 110. As shown in FIG. 2 (which shows a perspective view of the probe card assembly 114 and a partial perspective view of the head plate 110), the insert ring 112 can be shaped to receive the probe card assembly 114. For example, as shown in FIG. 2, the probe card assembly 114 can be generally annular and the insert ring 112 can be correspondingly annular. The probe card assembly 114 and insert ring 112 can, however, take other shapes (e.g., square, rectangular, etc.).

As shown in FIGS. 2-4 and best seen in FIG. 4, the probe card assembly 114 can comprise an attachment/stiffening structure 202, a wiring board 204, a flexible electrical connector 402, and a probe head assembly 404. The attachment/stiffening structure 202 can be configured to be attached to the insert ring 112 of the head plate 110 and can further be a stiffening structure that mechanically resists movement (e.g., movement or warping due to thermal changes or gradients, movement or warping due to mechanical loads, etc.) of the probe card assembly or parts of the probe card assembly. In addition, the probe head assembly 404 can be attached mechanically to the attachment/stiffening structure 202 by mounting mechanisms 214. As shown, the attachment/stiffening structure 202 can include a support structure 206, which can be a rigid structure to which the probe head assembly 404 is attached by the mounting mechanisms 214. For example, the support structure 206 can comprise a plate or a plate-like structure (e.g., comprising metal or other rigid materials). As another example, the support structure 206 can comprise a metal plate-like structure with empty spaces. As mentioned, the attachment/stiffening structure 202 can be configured to mechanically resist warping or deformation of the probe card assembly 114 due to, for example, thermal gradients or mechanical loads, that could otherwise affect the positions of the probes 116.

The wiring substrate 204 can comprise a plurality of electrical connectors 212 configured to make electrical connections with connectors 108 shown in FIG. 1. Although four are shown, more or fewer could be used. The wiring substrate 204 can include a plurality of electrical paths (e.g., one or more electrically conductive traces and/or vias on or in the wiring substrate 204) through the wiring substrate 204 between the electrical connectors 212 and flexible electrical connector 402. The flexible electrical connector 402 can provide electrical paths to the probe head assembly 404, which, in turn, can provide electrical paths through the probe head assembly 404 to the probes 116.

As shown, mounting mechanisms 214 can mechanically attach the probe head assembly 404 to the support structure 206. The mounting mechanisms 214 can thus be any device or mechanism suitable for attaching the probe head assembly 404 to the support structure 206. The mounting mechanisms 214 can thus be as simple as bolts, screws, clamps, or other mechanical attachment mechanisms. In some embodiments, however, the mounting mechanisms 214 can provide additional functionality. For example, each mounting mechanism can be configured to push and/or pull the probe head assembly 404 away or toward the support structure 206. For example, the mounting mechanisms 214 can comprise differential screw assemblies, each configured selectively to push the probe head assembly 404 away from the support structure 206 or pull the probe head assembly 404 toward the support structure 206 depending on which direction a rotating element of the differential screw assembly is rotated. As another example, each mounting mechanism 214 can comprise a pushing mechanism and a biasing mechanism. For example, the pushing mechanism can comprise a screw or bolt that, when rotated in a first direction, extends toward and thus pushes the probe head assembly 404 away from the support structure 206. The screw or bolt can be configured to retract away from the probe head assembly 404 when rotated in the opposite direction, allowing the biasing mechanism (which can be, for example, a spring) to push the probe head assembly 404 toward the support structure 206. By including a plurality of such mounting mechanisms 214 disposed to contact the probe head assembly 404 in different locations, the attitude (including, for example, a planarity, tilt, orientation, etc.) of the probe head assembly 404, and thus the tips of the probes 116, with respect to the support structure 206 can be selectively adjusted or changed. The mounting mechanisms 214 can also include the ability to lock mechanically in place a particular attitude of the probe head assembly 404 with respect to the support structure 206.

The wiring substrate 204 can be, for example, a printed circuit board substrate. The flexible connector 402 can be any suitable means for providing electrical connections between the wiring substrate 204 and the probe head assembly 404 that are sufficiently flexible to accommodate changes in the attitude (e.g., tilt, orientation, planarity, etc.) of the probe head assembly 404 with respect to the support structure 206. The flexible connector 402 can thus be as simple as a plurality of flexible wires. As another non-limiting example, flexible connector 402 can comprise an interposer comprising a substrate (e.g., a ceramic substrate, a printed circuit board substrate, etc.) with electrically conductive spring contacts extending from opposite surfaces of the substrate and electrical connections between ones of the spring contacts on one surface and others of the spring contacts on the other surface of the substrate.

The probe head assembly 404 can be as simple as a single substrate (e.g., a probe substrate) to which the probes 116 are attached. Alternatively, the probe head assembly 404 can comprise a plurality of independently moveable substrates (e.g., a plurality of probe substrates), and a subset of the probes 116 can be attached to each such independently moveable substrate. Such a probe head assembly 404 can include mechanisms for adjusting independently the position and orientation of each of the substrates with respect to the other substrates.

As shown in FIGS. 2-4, the attachment/stiffening structure 202 can also include a plurality of assemblies 208, 210 (e.g., arm assemblies) (eight are shown but more or fewer can be used). Some of the assemblies 208 can be adjustment assemblies 208, and others of the assemblies 210 can be lockable (e.g., can be clamped and unclamped) compliant assemblies 210 (e.g., clutched compliant mechanisms). (Although three adjustment assemblies 208 and five lockable compliant assemblies 210 are shown in the exemplary probe card assembly 114 of FIGS. 2-4, more or fewer of either type of assembly 208, 210 can be included in other embodiments or implementations.)

Each of the assemblies 208, 210 can include a mechanism (e.g., an attachment mechanism) that allows the assembly 208, 210 to be attached to and detached from the insert ring 112 of the head plate 110. For example, each adjustment assembly 208, 210 can be bolted, clamped, etc. to the insert ring 112. In addition, each adjustment assembly 208 can include an adjustment mechanism configured to move the assembly 208 with respect to the insert ring 112 (e.g., each adjustment mechanism can move the assembly 208 towards or away from the insert ring 112) while the probe card assembly 114 is attached to the insert ring 112. The adjustment assemblies 208 can thus change (e.g., adjust) the attitude (e.g., the tilt, orientation, or planarity) of the probe card assembly 114 with respect to the insert ring 112 (which can be an example of a reference structure). Each lockable compliant assembly 210 can include an attachment block 302 (which can be an example of an attachment mechanism) that can be securely attached to the insert ring 112, and a compliant mechanism 432 that can allow the support structure 206 to move with respect to the attachment block 302. The lockable compliant assemblies 210 can also include a locking mechanism 430 that can lock the compliant mechanism 432 such that the support structure 206 cannot appreciably move with respect to the attachment block 302. In other words, locking mechanism 430 can lock compliant mechanism 432 such that the lockable compliant assembly 210 mechanically resists movement of the support structure with respect to the attachment block 302 and the insert ring 112. Thus, while unlocked, each lockable compliant assembly 210 can allow movement of the support structure 206 (e.g., movement induced by the adjustment assemblies 208). Thus, for example, while unlocked, each lockable compliant assembly 210 can allow the attitude of the support structure 206 to be changed with respect to the insert ring 112 without substantially or appreciably influencing the attitude of the support structure 206. This is because, while unlocked, the lockable compliant assembly 210 allows the support structure 206 to move with respect to the insert ring 112. Typically, the greater the freedom of movement (e.g., with regard to the number of degrees of freedom of motion and/or friction) of the support structure 206 with respect to the insert ring 112 provided by the lockable compliant assembly 210 while unlocked, the less the unlocked lockable compliant assembly 210 will influence the attitude of the support structure with respect to the insert ring 206. Typically, if sufficient degrees of freedom of motion of the support structure 206 with respect to the insert ring 112 are provided, friction between the moving parts of the lockable compliant assembly 210 that provide those degrees of motion can be the only potentially significant source of influence by the unlocked lockable complaint assembly 210 on the attitude of the support structure 206 with respect to the insert ring 112. In some embodiments, at least four degrees of freedom of motion (e.g., rotation about the "x," "y," and "z" axes and translation along one of those axes) are a sufficient number of degrees of freedom, although in other embodiments more or fewer degrees of freedom of motion can be provided. Through proper construction and/or lubrication of the moving parts of the lockable compliant assembly 210, such friction can be reduced such that the influence of the unlocked lockable compliant assembly 210 on the attitude of the support structure 206 is negligible. While locked, however, each lockable compliant assembly 210 can provide mechanical stiffening or resistance to resist warping, deformation, or other movements of the probe card assembly 114 caused by, for example, thermal gradients, mechanical loading, etc. The lockable compliant assemblies 210 can thus be examples of lockable compliant structures.

An example of an adjustment assembly 208 according to some embodiments of the invention is shown in FIG. 4. As shown, the adjustment assembly 208 can include a foot 406, an extension 312 (e.g., an extension arm), and an actuator 314 (which can be an example of an adjustment mechanism). The foot 406 (which can be an example of an attachment mechanism) can be configured to be attached to and detached from the insert ring 112. For example, the foot 406 can comprise a metal block that includes holes that correspond to holes in the insert ring 112. Screws or bolts (not shown in FIG. 4) can pass through the holes in the foot 406 and the insert ring 112 to secure the foot 406 to the insert ring 112.

The extension 312 can comprise a block or other rigid structure comprising metal or other rigid materials integrally formed with the support structure 206. Alternatively, the extension 312 can comprise a block or structure that is rigidly secured to the support structure 206. The actuator 314 can be configured to attach the extension 312 to the foot 406, and the actuator 314 can further be configured selectively to move the extension 312 toward or away from the foot 406. The actuator 312 can comprise any device or mechanism, or combination of devices and/or mechanisms, that can attach the extension 312 to the foot 406 and provide the ability selectively to move the extension 312 with respect to the foot 406.

For example, the actuator 314 can comprise a spring-loaded bracket and a push actuator (not separately shown). The spring-loaded bracket (not separately shown) can secure the extension 312 to the foot 406 and bias with a spring force the extension 312 towards the foot 406. The push actuator (not separately shown) can comprise a screw assembly mounted on the extension 312 that, when turned in a first direction, extends toward the foot 406 and thus pushes the extension 312 away from the foot 406 against the biasing force of the spring-loaded bracket. The screw assembly (not shown) can, when turned in an opposite direction, retract away from the foot 406, allowing the spring biasing force of the spring-loaded bracket to pull the extension 312 towards the foot 406. In other embodiments, actuator 314 can be replaced by passive devices or methods for altering an attitude of the support structure 206. For example, rather than or in addition to actuators 314, one or more shims (not shown) could be placed between extension 312 and foot 406 in one or more of the adjustment assemblies 208 to alter the attitude of the support structure 206 with respect to the insert ring 112.

As should be apparent, by utilizing a plurality of such adjustment assemblies 208, the attitude (e.g., the tilt, orientation, planarity, etc.) of the support structure 206 can be adjusted or changed selectively with respect to the insert ring 112. Moreover, because the probe head assembly 404 is attached to the support structure 206 (e.g., by mounting mechanisms 214), selectively changing the attitude of the support structure 206 changes the attitude of the probe head assembly 404 and the contact tips of the probes 116 (which are attached to the probe head assembly 404) with respect to the insert ring 112. In addition, because the insert ring 112 and the chuck 134 can be part of or can be attached (directly or indirectly) to the housing 132, adjusting the attitude of the support structure 206, probe head assembly 404, and contact tips of the probes 116 with respect to the insert ring 112 also changes the attitude of the support structure 206, probe head assembly 404, and contact tips of the probes 116 with respect to the chuck 134 and the DUT 130 (with terminals 118) disposed on the chuck 134. Therefore, as shown in FIGS. 5A and 5B, the attitude of the support structure 206, and thus contact tips of the probes 116, can be adjusted with respect to the insert ring 112 and the DUT terminals 118. FIG. 5A shows support structure 206, and thus probe head assembly 404 and the contact tips of probes 116, with an attitude that is tilted with respect to the insert ring 112, and FIG. 5B shows support structure 206 with an attitude that is tilted, in a different direction, with respect to the insert ring 112. The attitude of the support structure 206, and thus the contact tips of the probes 116, can thus be changed with respect to any number of reference structures, including without limitation the insert ring 112, the chuck 234 (e.g., the surface of the chuck 234 on which the DUT 130 is placed), the DUT 130, and the terminals 118 of the DUT 130. The adjustment assemblies 208 and the lockable compliant assemblies 210 thus can, but need not, be mounted to a reference structure to which the attitude of the support structure 206 or probes 116 is changed.

As discussed, while unlocked the lockable compliant assemblies 210 can allow the support structure 206 to move relatively freely with respect to the insert ring 112. In some embodiments, the lockable compliant assemblies 210 can allow the attitude of the support structure 206 with respect to the insert ring 112 to be changed without appreciably influencing the attitude of the support structure 206. The support structure 206 and the adjustment assemblies 208 can be mechanically rigid or stiff and can provide mechanical resistance to loading 502 (e.g., forces) on the probes 116, probe head assembly 404, or other elements of the probe card assembly 114. The support structure 206 and the adjustment assemblies 208 can thus resist movement of the attachment/stiffening structure 202 (and thus the support structure 206, the probe head assembly 404, and the probes 116) due to such loading 502, which can arise from mechanical loading of the probes 116 (e.g., the chuck 134 pressing the terminals 118 of the DUT 130 against the probes 116) or from other sources (e.g., thermal gradients). While locked, the lockable compliant assemblies 210 can provide additional stiffness to the attachment/stiffening structure 202. That is, each lockable compliant assembly 210 can provide additional mechanical resistance to any loading 502. Indeed, the more lockable compliant assemblies 210 that are provided, the greater the additional stiffness (e.g., resistance to movement) provided.

Figure 6:
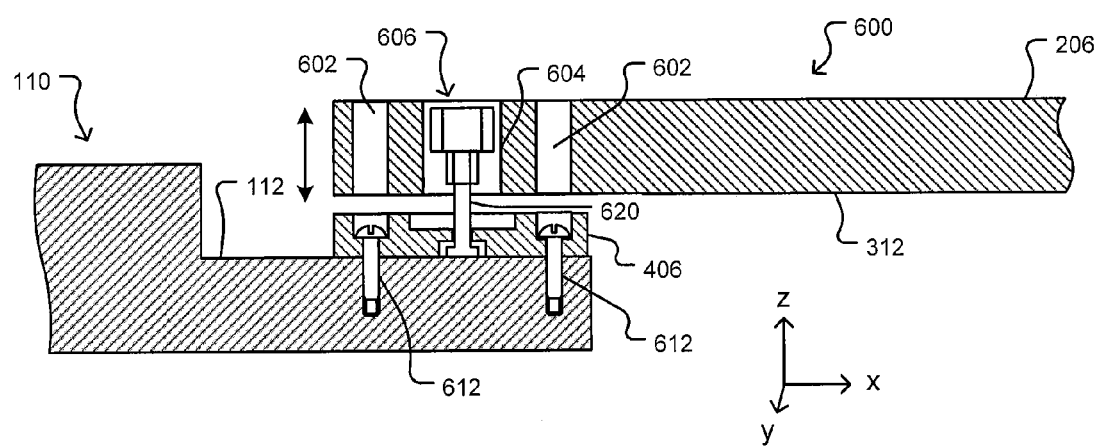
FIG. 6 illustrates an exemplary configuration of an adjustment assembly of the probe card assembly of FIG. 2 according to some embodiments of the invention.

FIG. 6 illustrates an exemplary adjustment assembly 600, which can be a non-limiting exemplary implementation of an adjustment assembly 208. As shown, screws 612 which can thread into threaded holes (not shown) in the insert ring 112, can attach the foot 406 to the insert ring 112. Access holes 602 can provide access through the extension 312 to the screws 612. A differential screw assembly 606, which can be an exemplary implementation of the actuator 314 of FIGS. 3 and 4, can be attached to the extension 312, for example, in an opening 604 in the extension 312. A shaft 620 of the differential screw assembly 606 can be attached to the foot 406 as shown in FIG. 6. As is known, rotation of a differential screw assembly 606 in one direction can extend the shaft 620 toward the foot 406, pushing the extension 312 away from the foot 406. Rotating the differential screw assembly 606 in the opposite direction can retract the shaft 620 away from the foot 406, pulling the extension 312 toward the foot 406.

As discussed above, the differential screw assembly 606 can be replaced with a push-only actuator and a spring loaded bracket. The spring loaded bracket (not shown) can attach the extension 312 to the foot 406 and can bias (e.g., with a spring) the extension 312 toward the foot 406. The push only actuator can include a shaft (not shown) that can be extended to push the extension 312 away from the foot 406 against the bias of the spring bracket. The shaft of the push only actuator can also be retracted away from the foot, allowing the spring biasing force of the bracket to pull the extension 312 toward the foot 406.

Referring again to FIG. 4, an example of a lockable compliant assembly 210 according to some embodiments of the invention is also shown in FIG. 4. As shown, each lockable compliant assembly 210 can include an attachment block 302, a compliant mechanism 432, and a locking mechanism 430. The attachment block 302 can be configured to be attached to and detached from the insert ring 112. For example, the attachment block 302 can comprise a metal block that includes holes that correspond to holes in the insert ring 112. Screws or bolts (not shown in FIG. 4) can pass through the holes in the attachment block 302 and the insert ring 112 to secure the attachment block 302 to the insert ring 112.

The compliant mechanism 432 can comprise any mechanism that mechanically connects the attachment portion 302 to the support structure 206 while allowing the support structure 206 to rotate, with respect to the attachment portion 302, about at least one of the "x," "y," and/or "z" axes and or translate along at least one of the "x," "y," and/or "z" axes. For example, the compliant mechanism 432 can comprise springs, gimbels, ball-socket structures, pivot structures, etc. The locking mechanism 430 can comprise any mechanism that rigidly locks the compliant mechanism 432 such that, while locked, the lockable compliant assembly 210 rigidly and generally immovably mechanically connects the support structure 206 to the attachment portion 302. For example, the locking mechanism 432 can comprise clutches, screws, bolts, parallel plate structures, etc.

Figure 7:
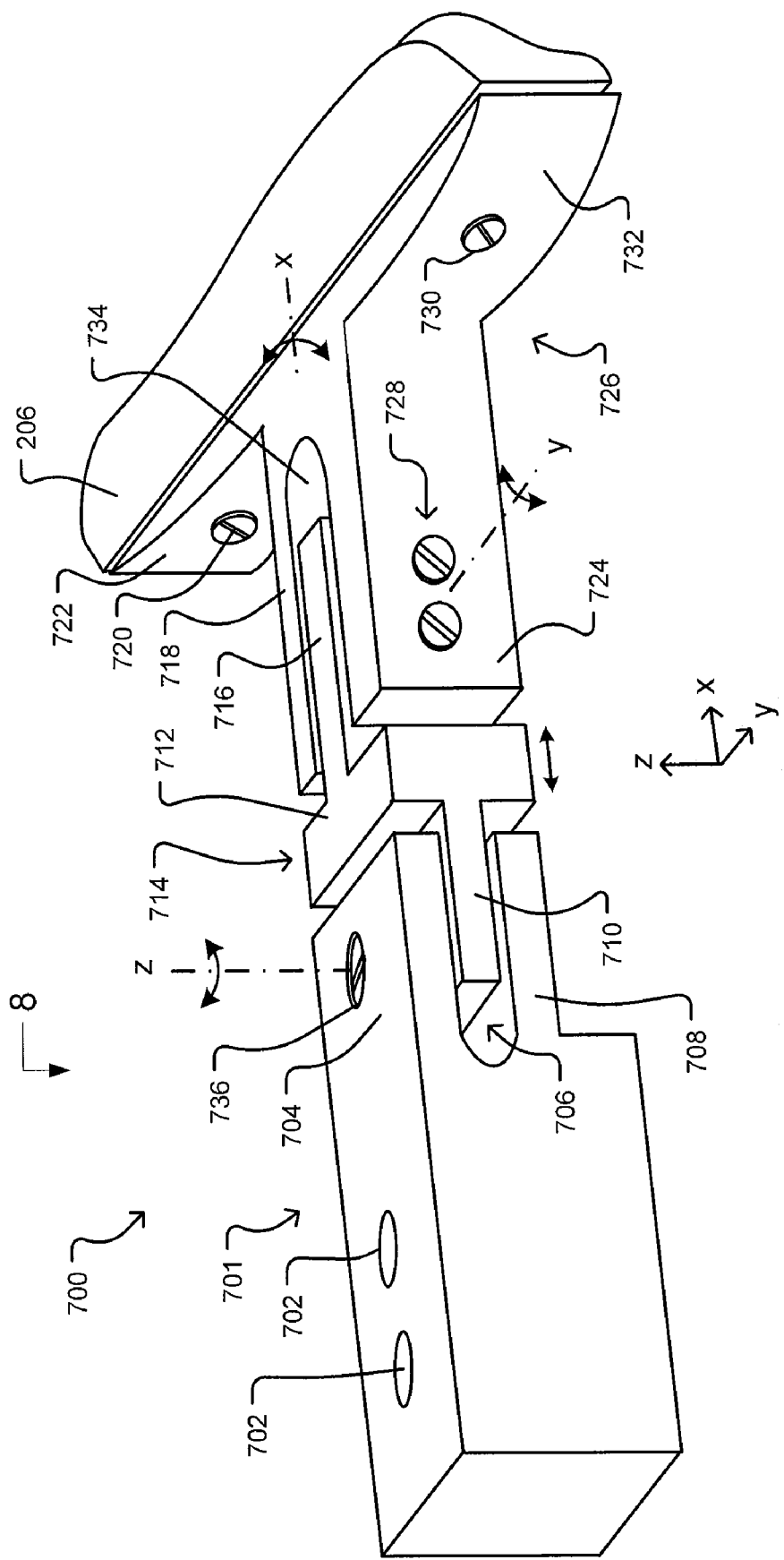
FIG. 7 illustrates a perspective view of an exemplary configuration of a lockable compliant assembly of the probe card assembly of FIG. 2 according to some embodiments of the invention.
Figure 8:
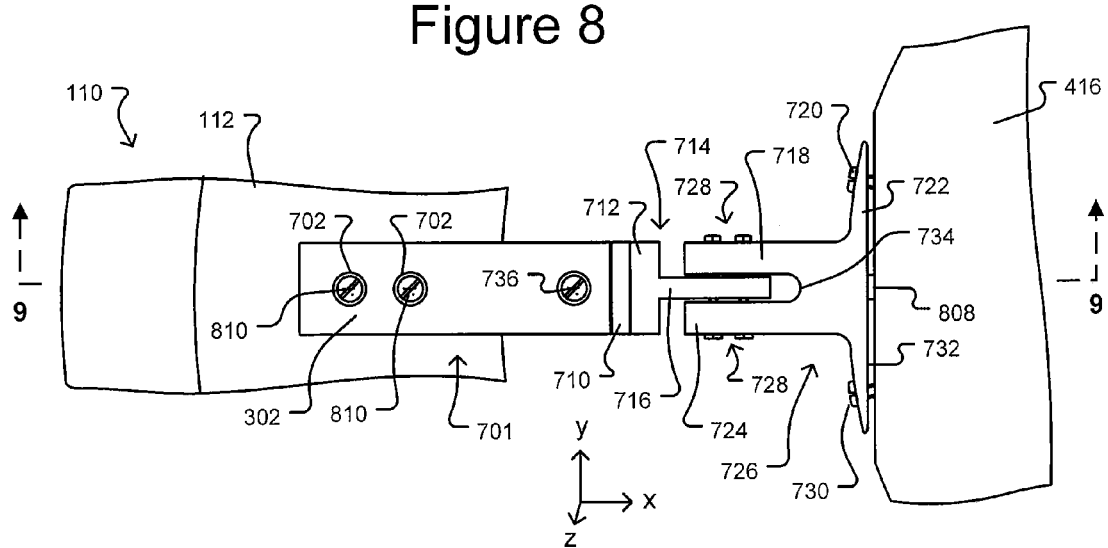
FIG. 8 illustrates a top view of the exemplary lockable compliant assembly of FIG. 7 with a partial view of a head plate.
Figure 9:
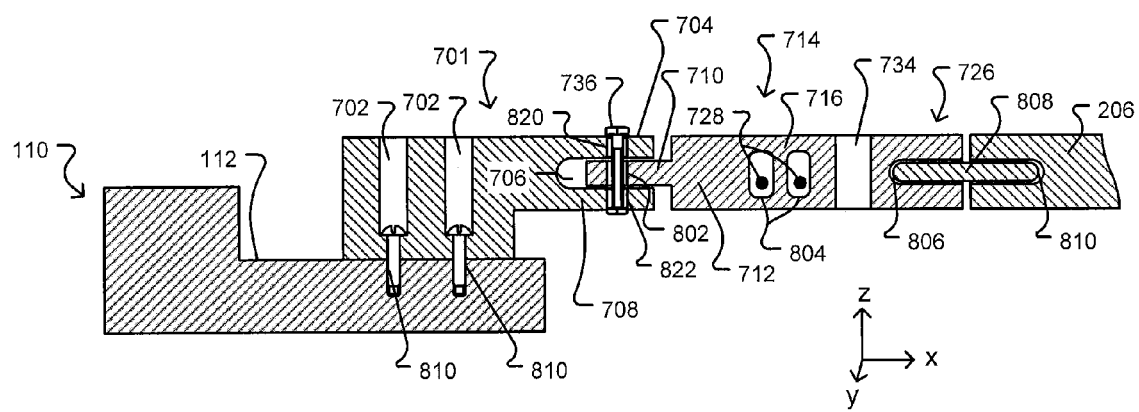
FIG. 9 illustrates a side, cross-sectional view of the exemplary lockable compliant assembly and head plate taken from FIG. 8.

FIGS. 7-9 illustrate an exemplary configuration 700 of the lockable compliant assembly 210 according to some embodiments of the invention. As shown, the exemplary configuration 700 of the lockable compliant assembly 210 shown in FIGS. 7-9 can include an attachment block 701, an interconnector block 714, and an end block 726.

As shown in FIGS. 8 and 9, the attachment block 701 can be attached to the insert ring 112 by screws 810, which can be threaded into holes (not shown) in the insert ring 112. As shown in FIGS. 7-9, access holes 702 can be provided in the attachment block 701 for screws 810. The attachment block 701 can thus be attached to the insert ring 112. As best seen in FIGS. 7 and 9, the attachment block 701 can also comprise fingers 704, 708 with a horizontal space 706 between the fingers 704, 708.

As shown in FIGS. 7-9, the end block 726 can comprises flanges 722, 732, which can be attached by screws 720, 730 to the support structure 206 of the attachment/stiffening structure 202 (see FIG. 2). The end block 726 can thus be attached to the support structure 206. As also shown, the end block can comprise fingers 718, 724 with a vertical space 734 between the fingers 718, 724.

As shown in FIGS. 7-9, the interconnector block 714, which can be located between the attachment block 701 and the end block 726, can comprise a body 712, a horizontal extension 710, and a vertical extension 716. The vertical extension 716 can extend from the body 712 into the vertical space 734 between fingers 718, 724 of the end block 726 as best seen in FIGS. 7 and 8. The horizontal extension 710 can extend from the body 712 into the horizontal space 706 between the fingers 704, 708 of the attachment block 701 as best seen in FIGS. 7 and 9.

Each of the attachment block 701, the interconnector block 714, and the end block 726 can be integrally formed from a single piece of rigid material (e.g., metal). Alternatively, each of the attachment block 701, the interconnector block 714, and the end block 726 can comprise structurally distinct elements that are mechanically connected to each other.

Figure 10A:
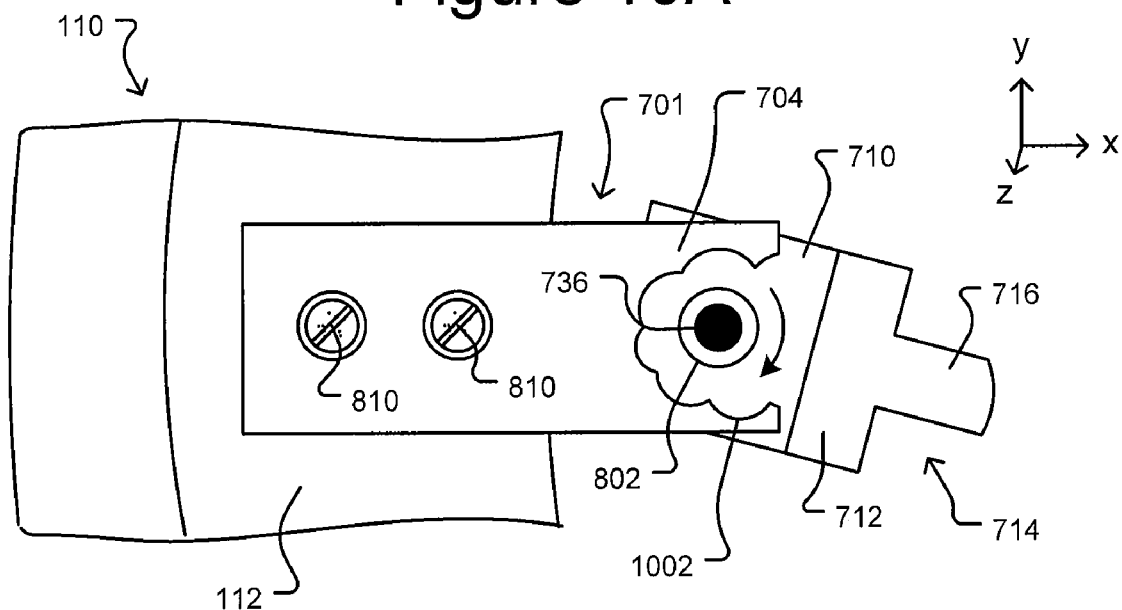
FIGS. 10A and 10B illustrate exemplary rotation of the interconnector block with respect to the attachment block of the lockable compliant assembly of FIGS. 7-9 according to some embodiments of the invention.
Figure 10B:
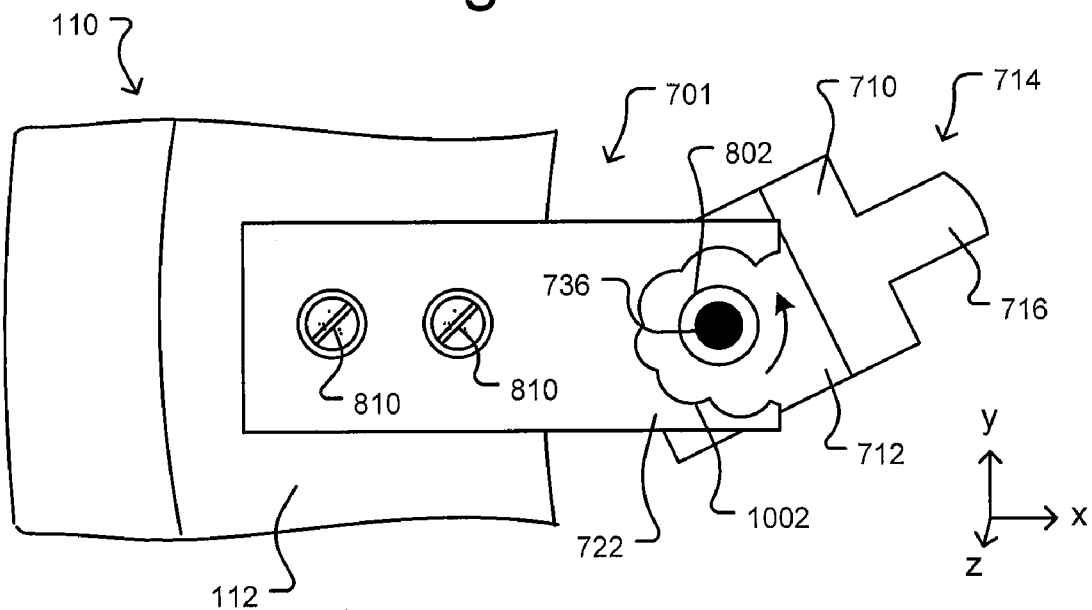

As shown in FIG. 7 and best seen in FIG. 9, the bolt of a bolt/nut pair 736 can pass through hole 820 in finger 704, hole 802 in horizontal extension 710 of the connector block 714, and hole 822 in finger 708. As shown in FIGS. 10A and 10B, while the bolt/nut pair 736 is loosened, the horizontal extension 710 of the interconnector block 714 can rotate about the axis of the bolt/nut pair 736 (which is labeled the "z" axis in FIGS. 7-10B). (FIG. 704 is shown in FIGS. 10A and 10B with cutout 1002 to review the shaft of the bolt in bolt/nut pair 736 and hole 802.) While tightened, however, the bolt/nut pair 736 can firmly press the fingers 704, 708 against the horizontal extension 710 and rigidly hold the horizontal extension 710 in place with respect to the fingers 704, 708. Thus, while the bolt/nut pair 736 is tightened, the horizontal extension 710 is not free to rotate about the axis of the screw 736 but is substantially immovable. The fingers 704, 708, and bolt/nut pair 736 can thus form a clutch mechanism that is engaged (locked) by tightening the bolt/nut pair 736 or disengaged (unlocked) by loosening the bolt/nut pair 736. Bolt/nut pair 736 can be replaced with a screw that threads into threaded holes in the fingers 704, 708 of the attachment block 701.

Figure 11A:
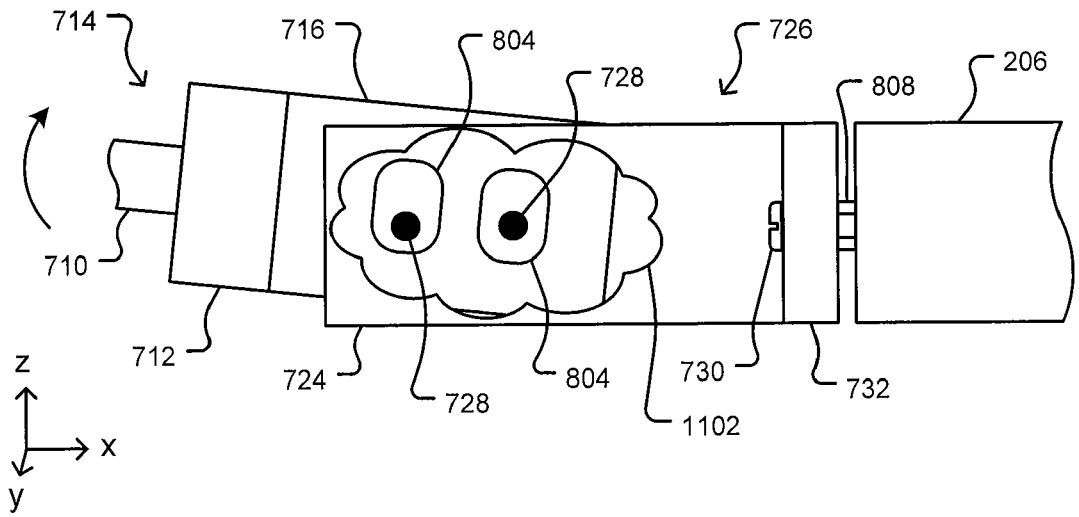
FIGS. 11A and 11B illustrate exemplary rotation of the interconnector block with respect to the end block of the lockable compliant assembly of FIGS. 7-9 according to some embodiments of the invention.
Figure 11B:
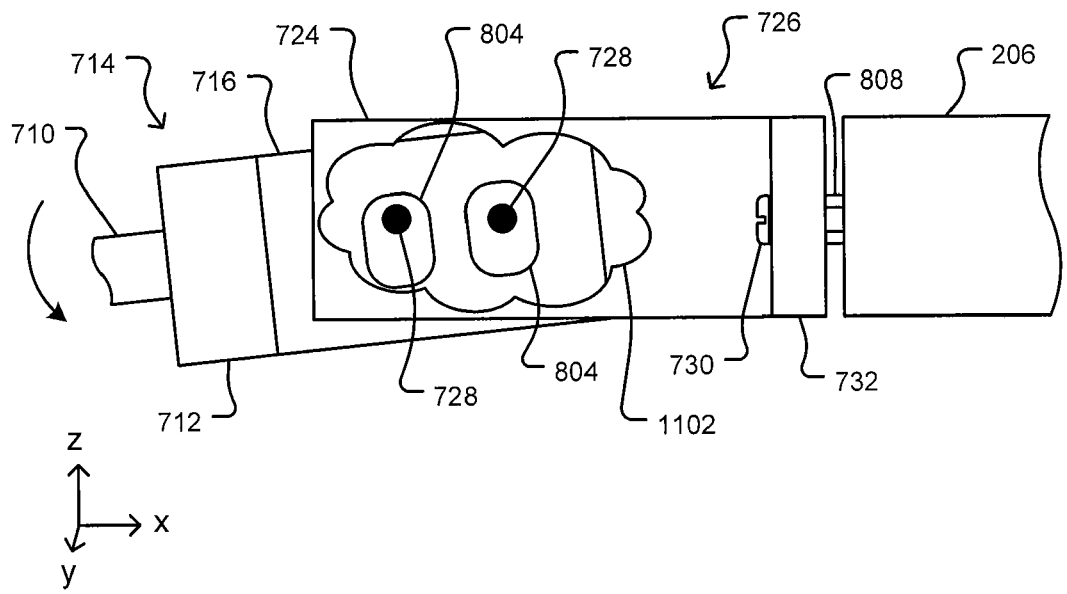
Figure 12:
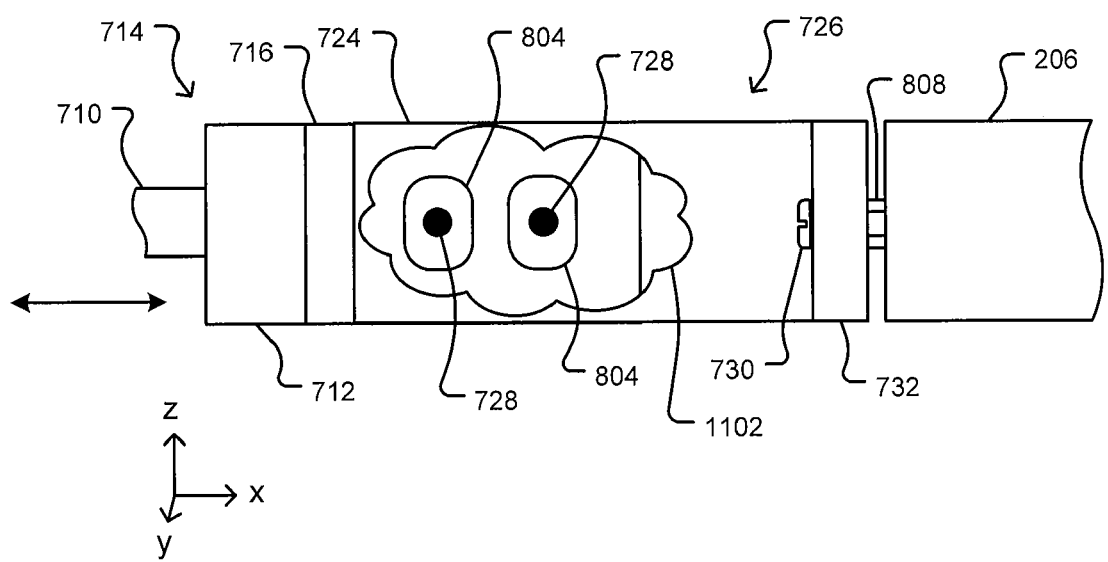
FIG. 12 illustrates exemplary translation of the interconnector block with respect to the end block of the lockable compliant assembly of FIGS. 7-9 according to some embodiments of the invention.

As shown in FIGS. 7-9 and best seen in FIGS. 8 and 9, the bolts of bolt/nut pairs 728 can pass through holes (not shown) in the fingers 718, 724 of the end block 726 and through oversized slots 804 (see FIG. 9) in the vertical extension 716 of the connector block 714. As shown in FIGS. 11A and 11B, while the bolt/nut pairs 728 are loosened, the vertical extension 716 of the interconnector block 714 can rotate generally about what is labeled the "y" axis in FIGS. 11A and 11B with respect to the fingers 718, 724 of the end block 726. The oversized slots 804 allow the rotation. As shown in FIG. 12, the oversize slots 804 can also allow the vertical extension 716 to translate along what is labeled the "x" axis in FIG. 12 with respect to the fingers 718, 724 of the end block 726. (Finger 724 is shown in FIGS. 11A, 11B, and 12 with cutout 1102 to show the shafts of the bolts in bolt/nut pairs 728 and oversized slots 804.) While tightened, however, the bolt/nut pairs 728 firmly press the fingers 718, 724 of the end block 726 against the vertical extension 716 and rigidly hold the vertical extension 716 in place with respect to the fingers 718, 724. Thus, while the bolt/nut pairs 728 are tightened, the vertical extension 716 is not free to rotate about the "y" axis or translate along the "x" axis but is substantially immovable. The fingers 718, 724, and bolt/nut pairs 728 can thus form a clutch mechanism that is engaged (locked) by tightening the bolt/nut pairs 728 or disengaged (unlocked) by loosening the bolt/nut pair 728. Bolt/nut pairs 728 can be replaced with screws that thread into threaded holes in the fingers 718, 724.

Figure 13A:
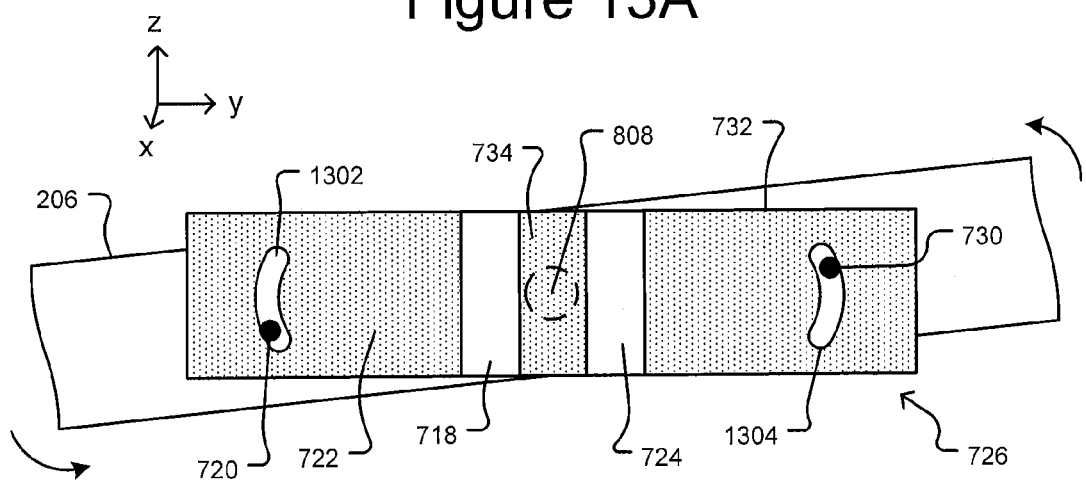
FIGS. 13A and 13B illustrate exemplary rotation of the support structure with respect to the end block of the lockable compliant assembly of FIGS. 7-9 according to some embodiments of the invention.
Figure 13B:
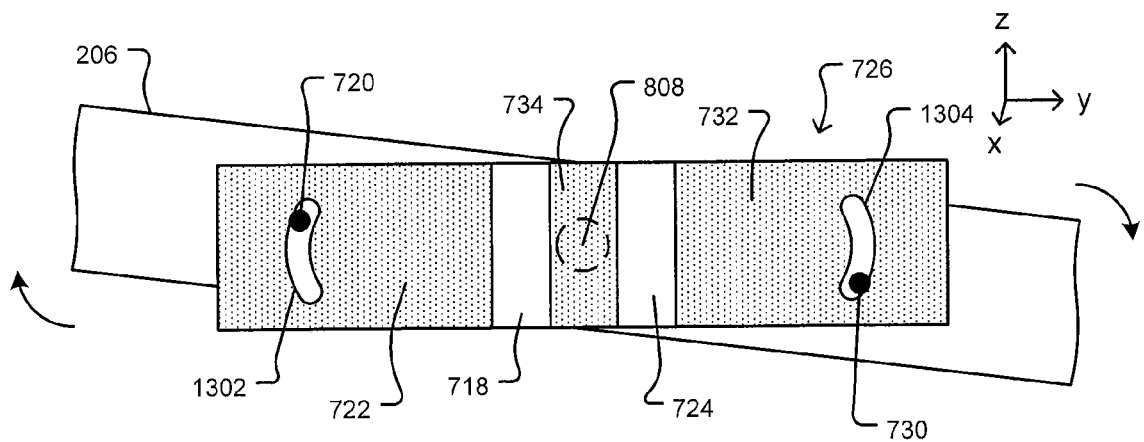

As shown in FIG. 9, a pin or dowel 808 can be disposed in corresponding hollow spaces 806, 810 in, respectively, the end block 726 and the support structure 206 of the attachment/stiffening structure 202 (see FIG. 2). As illustrated in FIGS. 13A and 13B, while the screws 720, 730 through flanges 722, 732 of the end block 726 are loosened, the support structure 206 of the attachment/stiffening structure 202 (see FIG. 2) can rotate, with respect to the end block 726, about the dowel 808. As also shown in FIGS. 13A and 13B, oversized and/or arced slots 1302, 1304 in the flanges 722, 732 of the end block 726 allow the support structure 206 to rotate with respect to the otherwise stationary screws 720, 730. While tightened, however, screws 720, 730 hold the flanges 722, 732 of the end block 726 generally immovably and rigidly with respect to the support structure 206. Thus, while screws 720, 730 are tightened, the support structure 206 cannot rotate or move with respect to the end block 726. The flanges 722, 732, support structure 206, and screws 720, 730 can thus form a clutch mechanism that is engaged (locked) by tightening the screws 720, 730 or disengaged (unlocked) by loosening the screws 720, 730. The dowel 808 is exemplary only and can be replaced by, for example, a structure that is flexible in one direction but rigid in another direction. For example, the dowel 808 can be replaced with a structure that is flexible in a direction that corresponds to rotation about the "z" axis in FIGS. 8-10 but rigid in directions that correspond to rotation about the "x" and "y" axes. A non-limiting example of such a structure is a C flex bearing.

As should be apparent, the attachment block 701, interconnector block 714, and end block 726 shown in FIGS. 7-13B are a non-limiting exemplary configuration of a lockable compliant assembly 210 of FIGS. 2-5B according to some embodiments of the invention. Generally speaking, the nut/bolt pairs 736, 728, fingers 704, 708, 716, 724, and the screws 720, 730 are non-limiting examples of the locking mechanism 432 of the lockable compliant assembly 210 of FIGS. 2-5B. The interconnector block 714, hole 802 and oversized slots 804, 1302, 1304 are non-limiting examples of the compliant mechanism 432 of the lockable compliant assembly 210 of FIGS. 2-5B.

Figure 14:
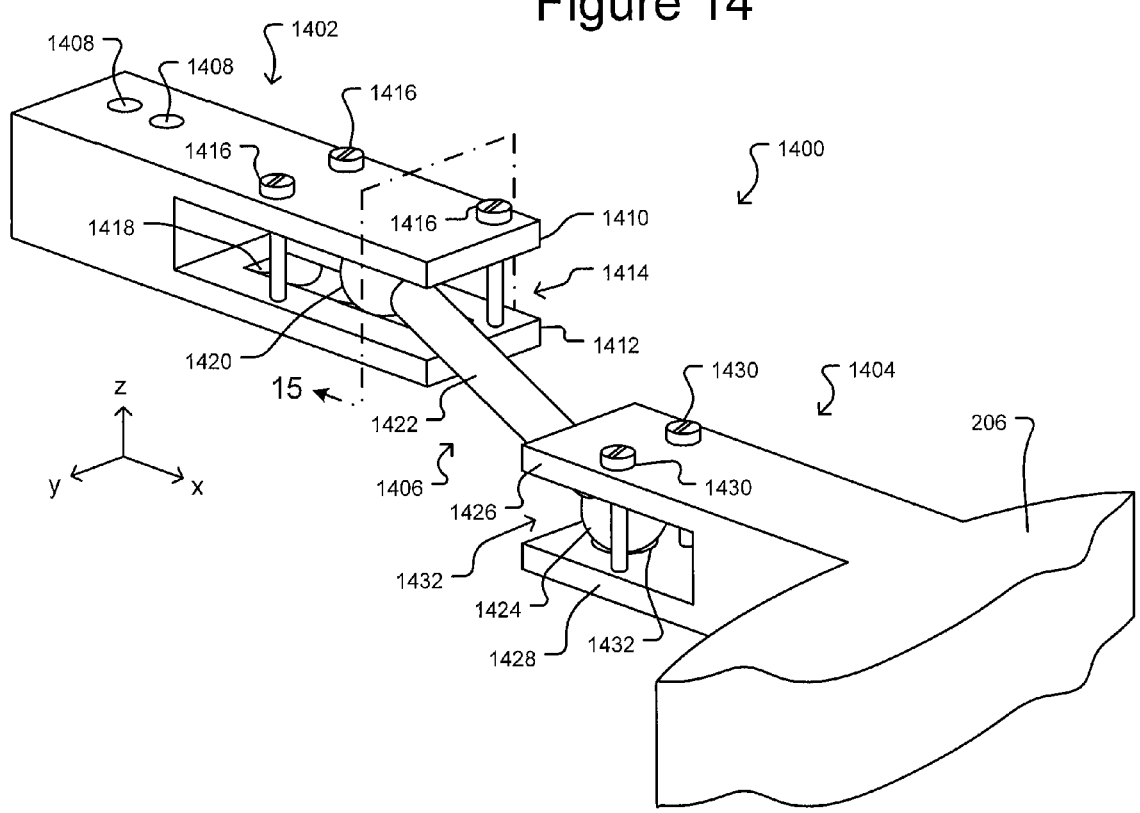
FIG. 14 illustrates a perspective view of another exemplary configuration of a lockable compliant assembly of the probe card assembly of FIG. 2 according to some embodiments of the invention.
Figure 15:
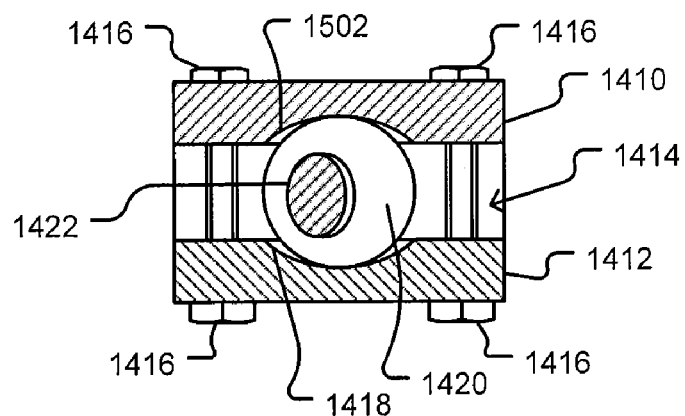
FIG. 15 illustrates a cross-sectional view of the attachment block of the lockable compliant assembly of FIG. 14.
Figure 16:
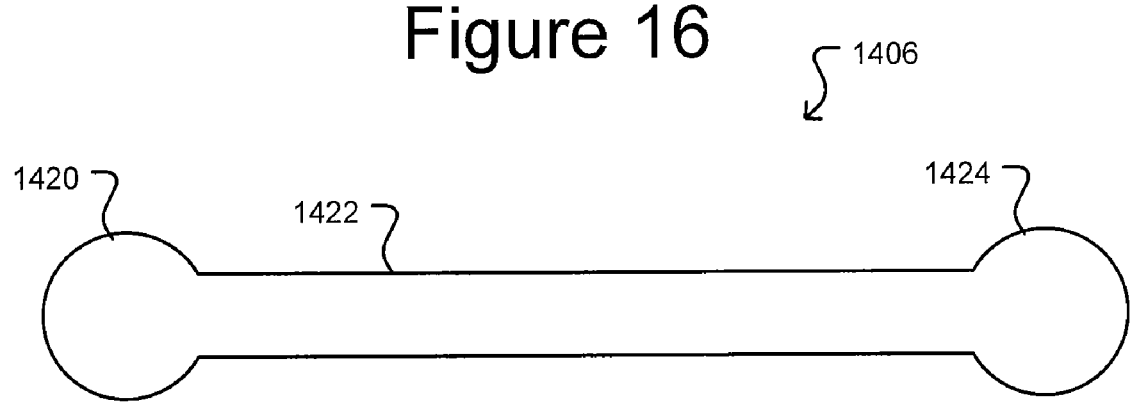
FIG. 16 illustrates an exemplary configuration of the dumbbell structure of the lockable compliant assembly of FIG. 14 according to some embodiments of the invention.

FIGS. 14-16 illustrate another exemplary lockable compliant assembly 1400 according to some embodiments of the invention. The lockable compliant assembly 1400 can be another non-limiting example of the lockable compliant assembly 210 of FIGS. 2-5B. As shown, the lockable compliant assembly 1400 can comprise an attachment block 1402, a dumbbell structure 1406, and an end block 1404. As will be seen, the attachment block 1402 can comprise metal or other rigid materials and can be attached to the insert ring 112 in the test system 100 shown in FIG. 1. The end block 1404, which can also comprise metal or other rigid materials can be integrally formed with or attached to the support structure 206 of the attachment/stiffening structure 202 (see FIG. 2) of the probe card assembly 114. The dumbbell structure 1406 can allow the end block 1404, and thus the support structure 206, to move with respect to the attachment block 1402. For example, the dumbbell structure 1406 can allow the support structure 206 to rotate about one or more of the "x," "y," and/or "z" axes and/or to translate along one or more of the "x," "y," and/or "z" axes.

As shown in FIG. 14, the attachment block 1402 can include holes 1408, which can be like holes 702 (see FIG. 9), and can thus be configured to receive screws (not shown in FIGS. 14-16) for attaching the attachment block 1402 to the insert ring 112 of the system 100 of FIG. 1. The attachment block 1402 can thus be attached to the insert ring 112 in the same way that attachment block 701 is attached to an insert ring 112. (See FIG. 9.) As also shown in FIG. 14, the attachment block 1402 can comprise fingers 1410, 1412 with a space 1414 between the fingers 1410, 1412. A trench 1418 can be formed into one of the fingers 1412 and a corresponding trench 1502 (see FIG. 15) can be formed into the other of the fingers 1410. The trenches 1418, 1502 can be configured to receive one of the spheres 1420 of the dumbbell structure 1406. Bolt/nut pairs 1416 can be provided as shown in FIGS. 14 and 15 between the fingers 1410, 1412. While the bolt/nut pairs 1416 are loosened, the sphere 1420 can be free to rotate about any or all of the "x," "y," and/or "z" axes and can also be free to translate along the length of the trenches 1418, 1502 (which is along what is labeled in FIG. 14 the "x" axis). While tightened, however, the bolt/nut pairs 1416 can press the fingers 1410, 1412 firmly against the sphere 1420, locking the sphere 1420 in place. Thus, while the bolt/nut pairs 1416 are tightened, the sphere 1420 is not free to rotate or translate but is rigidly locked in place. The fingers 1410, 12 and bolt/nut pairs 1416 can thus form a clutch mechanism that is engaged (locked) by tightening the bolt/nut pair 1416 or disengaged (unlocked) by loosening the bolt/nut pair 1416. Bolt/nut pairs 1416 can be replaced by screws that thread into threaded holes in the fingers 1410, 1412.

As shown in FIG. 14, the end block 1404 can be integrally formed with the support structure 206 of the attachment/stiffening structure 202 (see FIG. 2). Alternatively, the end block 1404 can be structurally separate from the support structure 206 but rigidly and firmly attached to the support structure 206. As shown, the end block 1404 can include fingers 1426, 1428 with space 1432 between the fingers. Each finger 1426, 1428 can include a matching dish-shaped feature, one 1432 of which is visible in FIG. 14, for receiving another sphere 1424 of the dumbbell structure 1406. Bolt/nut pairs 1430 can be provided as shown in FIG. 14 between the fingers 1426, 1428. While the bolt/nut pairs 1430 are loosened, the sphere 1424 can be free to rotate about any or all of the "x," "y," and/or "z" axes. While tightened, however, the bolt/nut pairs 1430 can press the fingers 1426, 1428 firmly against the sphere 1424, locking the sphere 1424 in place. Thus, while the bolt/nut pairs 1430 are tightened, the sphere 1424 is not free to rotate but is rigidly locked in place. The fingers 1426, 1428 and bolt/nut pairs 1430 can thus form a clutch mechanism that is engaged (locked) by tightening the bolt/nut pair 1430 or disengaged (unlocked) by loosening the bolt/nut pair 1430. Bolt/nut pairs 1430 can be replaced by screws that thread into threaded holes in the fingers 1426, 1428.

As shown in FIG. 14, the dumbbell structure 1406 can comprise the spheres 1420, 1424, which can be attached to opposite ends of a bar 1422. FIG. 16 illustrates a non-limiting example of the dumbbell structure 1406. As shown, the spheres 1420, 1424 can be attached to or integrally formed with the bar 1422. The spheres 1420, 1424 and the bar 1422 can comprise metal or other rigid materials.

As should be apparent, the bolt/nut pairs 1416, 1430 can be non-limiting examples of the locking mechanism 430 of FIGS. 2-4, and the dumbbell structure 1406 can be an non-limiting example of the compliant mechanism 432 of FIGS. 2-4.

Figure 17:
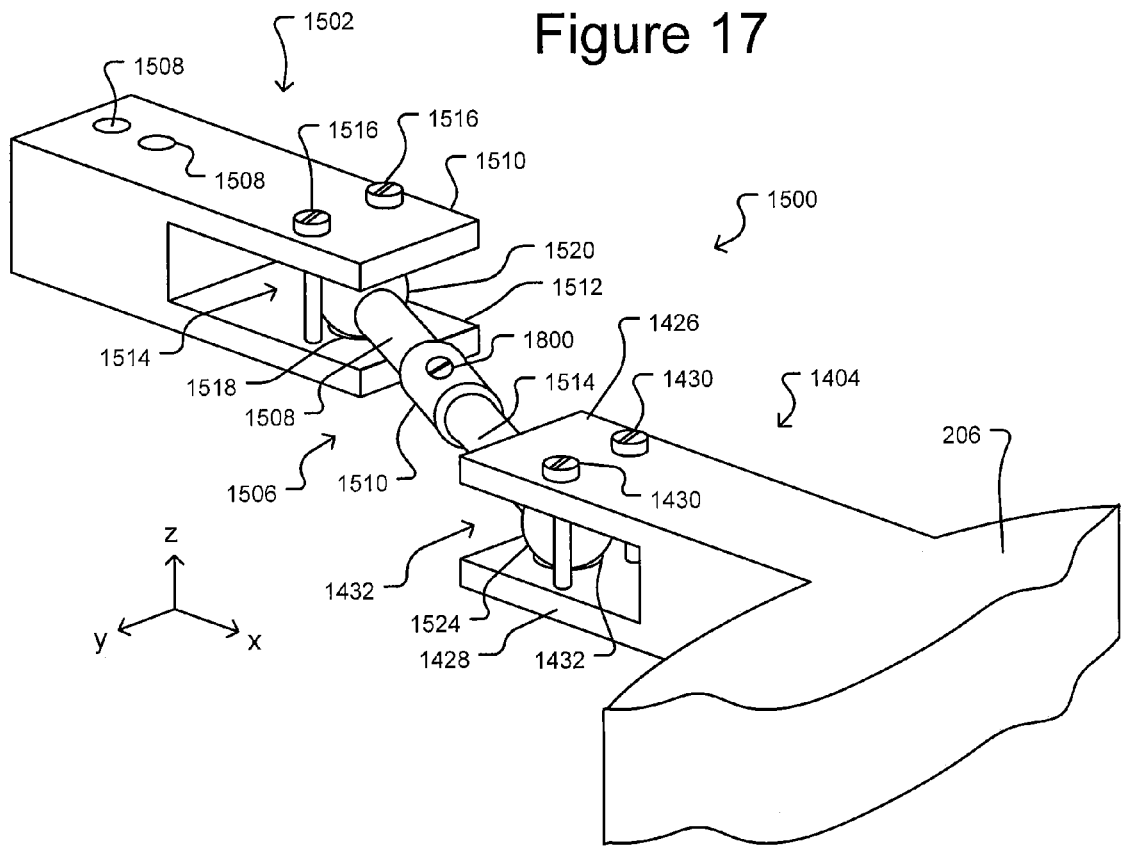
FIG. 17 illustrates a perspective view of yet another exemplary configuration of a lockable compliant assembly of the probe card assembly of FIG. 2 according to some embodiments of the invention.
Figure 18:
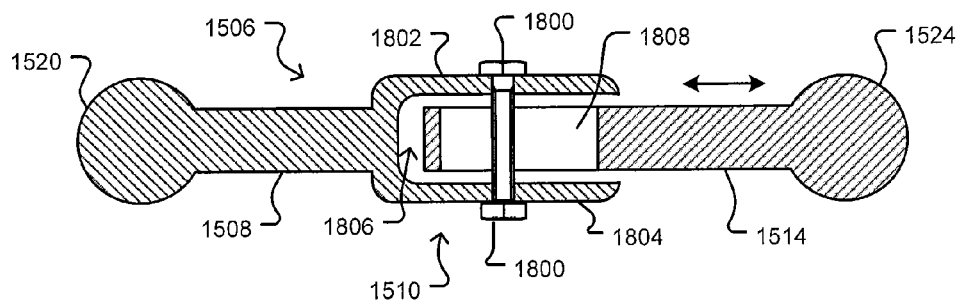
FIG. 18 illustrates an exemplary configuration of the dumbbell structure of the lockable compliant assembly of FIG. 17 according to some embodiments of the invention.

FIGS. 17 and 18 illustrate an exemplary alternative configuration 1500 of the lockable compliant assembly 1400 of FIGS. 14-16 according to some embodiments of the invention. The lockable compliant assembly 1500 shown in FIGS. 17 and 18 is thus another non-limiting example of the lockable compliant assembly 210 of FIGS. 2-5B.

As shown in FIG. 17, the lockable compliant assembly 1500 can comprise the end block 1404 configured as shown in FIG. 14 and as described above, including all alternative configurations. As also shown in FIG. 17, the lockable compliant assembly 1500 can also comprise an attachment block 1502 and a dumbbell structure 1506.

The attachment block 1502 can be generally similar to attachment block 1402 of FIG. 14 except that attachment block 1502 can comprise a dish-shaped feature 1518 in finger 1512 and a corresponding dish-shaped feature (not visible in FIG. 17) in finger 1510 (which can be generally similar to the dish-shaped features in FIGS. 1426, 1428 of end block 1404) rather than the trenches 1502, 1418 in the fingers 1410, 1412 of attachment block 1402. Otherwise, attachment block 1502 can include holes 1508 (which can be like holes 1408) for receiving screws (not shown but which can be like screws 810 of FIG. 9) for attaching the attachment block 1502 to the insert ring 112 of the head plate 110 of FIG. 2. Fingers 1510, 1512 (which can be like fingers 1410, 1412 of FIG. 14) can provide space 1514 for a sphere 1520 of the dumbbell structure 1506. Bolt/nut pairs 1516 can be configured to press firmly, while tightened, the fingers 1510, 1512 against the sphere 1520 so that the sphere 1520 cannot rotate. While the bolt/nut pairs 1516 are loosened, however, the sphere 1520 can be free to rotate in dish feature 1520. The fingers 1510, 1512 and bolt/nut pairs 1516 can thus form a clutch mechanism that is engaged (locked) by tightening the bolt/nut pairs 1516 or disengaged (unlocked) by loosening the bolt/nut pair 1516.

As shown in FIG. 17 and FIG. 18 (which show a cross-sectional side view of the dumbbell structure 1506), the dumbbell structure 1506 can comprise two spheres 1520, 1524 and a bar assembly 1510. As shown in FIG. 17, sphere 1520 can be disposed in the dish feature 1518 of the attachment block 1502, and the sphere 1524 can be disposed in the dish feature 1432 of the end block 1404. A first bar 1508 can be attached to the sphere 1520 (for example, the first bar 1508 can be attached to the sphere 1520 in the same way that bar 1422 is attached to sphere 1420), and the second bar 1514 can similarly be attached to the other sphere 1524.

As shown in FIG. 18, the bar assembly 1510 can be configured to allow translational movement of one of the bars (e.g., the second bar 1514) with respect to the other bar (e.g., the first bar 1508). For example, as shown in FIG. 18, the first bar 1508 can be integrally formed with or rigidly attached to a housing comprising an outer casing 1802 that forms an interior space 1806. An end of the second bar 1514, which can include an elongated slot 1808, can be placed in the casing 1802, and a bolt of a bolt/nut pair 1800 can extend through the elongate slot 1808 in the second bar 1514 and holes (not shown) in the casing 1802.

The bolt/nut pair 1800 can be tightened, which can press the casing 1802 against the second bar 1514, locking the second bar 1514 in place such that the second bar 1514 cannot move with respect to the first bar 1508. While the bolt/nut pair 1800 is loosened, however, the second bar 1514 can be free to slide within the casing and thus translate 1810 with respect to the first bar 1508 along an axis of the first bar 1508. The casing 1802 and bolt/nut pair 1800 can thus form a clutch mechanism that is engaged (locked) by tightening the bolt/nut pair 1800 or disengaged (unlocked) by loosening the bolt/nut pair 1800. The spheres 1520, 1424 and bars 1508, 1514 can comprise metal or other rigid materials.

Figure 19:
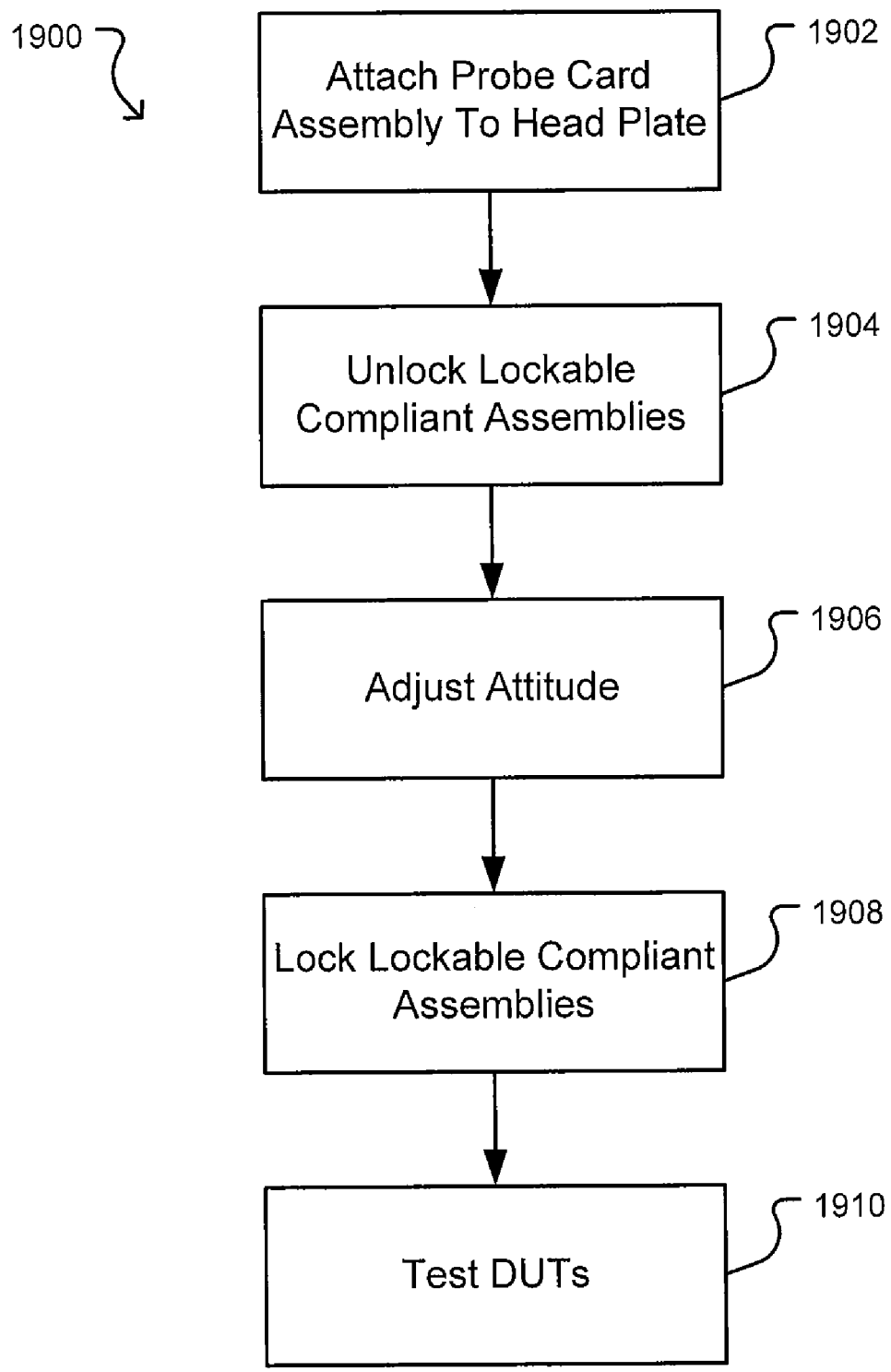
FIG. 19 illustrates an exemplary process that can be implemented on the system of FIG. 1 according to some embodiments of the invention.

FIG. 19 shows an exemplary process 1900 that can be performed using the system 100 of FIG. 1 to test DUTs like DUT 130. As shown in FIG. 19, at 1902, a probe card assembly 114 can be attached to the head plate 110 of the housing 132 (see FIG. 1). For example, the adjustment assemblies 208 and the lockable compliant assemblies 210 of the probe card assembly 114 of FIGS. 2-4 can be attached to the insert ring 112 of the head plate 110. If, for example, the adjustment assemblies 208 are configured as shown in FIG. 6, the foot 406 of each adjustment assembly 600 can be attached by screws 512 to the insert ring 112 as shown in FIG. 6. If the lockable compliant assemblies 210 are configured as shown in FIGS. 7-9, the attachment block 701 of each lockable compliant assembly 700 can be attached by screws 810 to the insert ring 112 as shown in FIG. 9. Alternatively, if the lockable compliant assemblies 210 are configured as shown in FIG. 14 or FIG. 17, the attachment block 1402 or the attachment block 1502 can be attached by screws (not shown) inserted into holes 1408 or 1508 and threaded onto corresponding holes (not shown) in the insert ring 112 as generally described above.

Referring again to FIG. 19, at 1904, the lockable compliant assemblies 210 can be unlocked at 1904. For example, the locking mechanism 430 on each of the lockable compliant assemblies 210 of the probe card assembly 114 in FIGS. 2-4 can be unlocked. As discussed above, while locking mechanism 430 is unlocked, the compliant mechanism 432 of each lockable compliant assembly 210 can allow the support structure 206 of the attachment/stiffening structure 202 to move with respect to the attachment block 302 of each lockable compliant assembly 210.

For example, if the lockable compliant assemblies 210 are configured like the lockable compliant assembly 700 of FIG. 7, the lockable compliant assembly 700 can be unlocked by loosening bolt/nut pairs 736 and 728 and screws 720, 730 as generally discussed above. As another example, if the lockable compliant assemblies 210 are configured like the lockable compliant assembly 1400 of FIG. 14, the lockable compliant assemblies 210 can be unlocked by loosening bolt/nut pairs 1416 and bolt/nut pairs 1430. As yet another example, if the lockable compliant assemblies 210 are configured like the lockable compliant assembly 1700 of FIG. 17, the lockable compliant assemblies 210 can be unlocked by loosening bolt/nut pairs 1416, 1430, 1800.

Referring again to FIG. 19, at 1906, the attitude of the probe card assembly 114 can be adjusted. For example, one or more of the actuators 314 on one or more of the adjustable assemblies 208 can be activated to change or adjust selectively the position of a corresponding extension 312 with respect to the insert ring 112. As discussed above and illustrated in FIGS. 5A and 5B, by providing a plurality such adjustable assemblies 208, the attitude (e.g., tilt, orientation, planarity, etc.) of the support structure 206 of the attachment/stiffening structure 202 can be selectively changed or adjusted with respect to the insert ring 112 to which the probe card assembly 114 was attached at 1902. As discussed above, because the probe head assembly 404 is attached to the support structure 206 (e.g., by mounting mechanisms 214), selectively changing the attitude of the support structure 206 changes the attitude of the probe head assembly 404 and the contact tips of the probes 116 (which are attached to the probe head assembly 404) with respect to the insert ring 112. In addition, because the insert ring 112 and the chuck 134 can be part of or can be attached (directly or indirectly) to the housing 132, adjusting the attitude of the support structure 206, probe head assembly 404, and contact tips of the probes 116 with respect to the insert ring 112 can also change the attitude of the support structure 206, probe head assembly 404, and contact tips of the probes 116 with respect to the chuck 134 and the DUT 130 (with terminals 118) disposed on the chuck 134. Therefore, 1906 in FIG. 19 can accomplish selective adjustment of the attitude of the contact tips of the probes 116 with respect to the terminals 118 of the DUT 130. For example, the attitude of the contact tips of the probes 116 can be selectively adjusted at 1906 to correspond to the attitude of the terminals 118 of the DUT 130.

As discussed above, because the locking mechanisms 430 on each lockable compliant assembly 210 were unlocked at 1904 of FIG. 19, the compliant mechanism 432 on each lockable compliant assembly 210 can allow the support structure 206 to move with respect to the attachment blocks 312 of each lockable compliant assembly 210, which as discussed above, were attached to the insert ring 112 at 1902. Thus, as actuators 314 change the attitude of the support structure 206 during 1906 of FIG. 19, the compliant mechanisms 432 on each lockable compliant assembly 210 can allow the support structure 206 to move with respect to the attachment blocks 302 of each lockable compliant assembly 210, and thus with respect to any of a number of possible reference structures including, as discussed above, the insert ring 112, the chuck 134, the DUT 130, the terminals 118 of the DUT 130, etc. Moreover, while unlocked, the compliant assemblies 210 can be configured to allow the support structure 206 to move, at least in one or more degrees of motion, relatively freely and thus exert negligible influence on the attitude of the support structure 206.

Referring again to FIG. 19, the lockable compliant assemblies 210 can be locked at 1904. For example, the locking mechanism 430 on each of the lockable compliant assemblies 210 of the probe card assembly 114 in FIGS. 2-4 can be locked. As discussed above, the locking mechanism 430 can lock the compliant mechanism 432 in each lockable compliant assembly 210 such that the support structure 206 cannot move with respect to the attachment block 302 of each lockable compliant assembly 210. Thus, once the attitude of the support structure 206 with respect to the insert ring 112 (and thus the attitude of the contact tips of the probes 116 with respect to the terminals 118 of the DUT 130) is set as desired at 1906, each lockable compliant assembly 210 can be locked such that no further movement (or no appreciable further movement) of the support structure 206 with respect to the attachment blocks 302 is allowed. Once the locking mechanisms 430 on the lockable compliant assemblies 210 are locked, each lockable compliant assembly 210 can become a rigid structure that resists movement of the support structure 206 (and thus the probe head assembly 404 and the probes 116) during testing of the DUT. For example, the lockable compliant assemblies 210, while the locking mechanism 430 are locked, can provide mechanical resistance to movement of the support structure 206, probe head assembly 404, and probes 116 during testing of the DUTs 130 due to, for example, thermal gradients, mechanical loads placed on the probes 116, etc. And the stiffness or mechanical resistance to motion (e.g., motioned induced by loading such as loading 502 shown in FIGS. 5A and 5B) provided by each locked lockable compliant assembly 210 can be in addition to stiffness or mechanical resistance to motion provided by other elements of the probe card assembly 114, such as the adjustment assemblies 208 and the support structure 206. Moreover, the compliant mechanisms 432 allow the lockable compliant assemblies 210 to provide the foregoing mechanical resistance without influencing (or without appreciably influencing) the attitude of the support portion (and thus the attitude of the probe head assembly 404 and contact tips of the probes 116) with respect to the insert ring 112 (and thus the chuck 134, DUT 130, and terminals 118 of the DUT 130).

As mentioned, each lockable compliant assembly 210 can be locked by locking its locking mechanism 430. For example, if the lockable compliant assemblies 210 are configured like the lockable compliant assembly 700 of FIG. 7, the lockable compliant assembly 210 can be locked by tightening bolt/nut pairs 736 to press fingers 704, 708 of the attachment block 701 firmly against the horizontal extension 710 of the interconnector block 714 as generally described above; by tightening bolt/nut pairs 728 to press fingers 718, 724 of the end block 726 firmly against the vertical extension 716 of the interconnector block 1714 as generally described above; and by tightening screws 720, 730 to firmly attach the flanges 722, 732 of the end block 726 to the support structure 206 as generally described above. As another example, if the lockable compliant assemblies 210 are configured like the lockable compliant assembly 1400 of FIG. 14, the lockable compliant assemblies 210 can be locked by tightening bolt/nut pairs 1416 to press fingers 1410, 1412 firmly against sphere 1420 as generally described above; and by tightening bolt/nut pairs 1430 to press fingers 1426, 1428 of the end block 1404 firmly against sphere 1424 as generally described above (see FIG. 14). As yet another example, if the lockable compliant assemblies 210 are configured like the lockable compliant assembly 1500 of FIG. 17, the lockable compliant assemblies 210 can be locked by tightening bolt/nut pairs 1516 to firmly press fingers 1510, 1512 against sphere 1520 as generally discussed above; by tightening bolt/nut pairs 1430 to firmly press fingers 1426, 1428 against sphere 1524 as generally discussed above; and by tightening bolt/nut pair 1800 to firmly press casing 1802 against the second bar 1514 as generally discussed above.

At 1910 of FIG. 19, DUTs 130 can be tested. For example, chuck 134 can be positioned to press selected ones of the DUT terminals 118 against selected ones of the probes 116 to establish electrical connections between the ones of the probes 116 and the ones of the terminals 118. As discussed above, the tester 102 can then provide power and test signals through the connector 104, electronics in the test head 106, the connectors 108, and the probe card assembly 114 to the DUT 130. Response signals generated by the DUT 130 in response to the test signals can be provided to the tester 102 through the probe card assembly 114, connectors 108, electronics in the test head 106, and connector 104. The tester 102 can then evaluate the response signals to determine whether the DUT 130 (or elements of the DUT 130) passed the testing. The chuck 134 can reposition the DUT 130 such that other terminals 118 are brought into contact with the probes 116 as many times as needed in order to test the entire DUT 130. Once the DUT 130 is tested, a new DUT can be placed on the chuck 134, and the new DUT can be tested.

Figure 20:
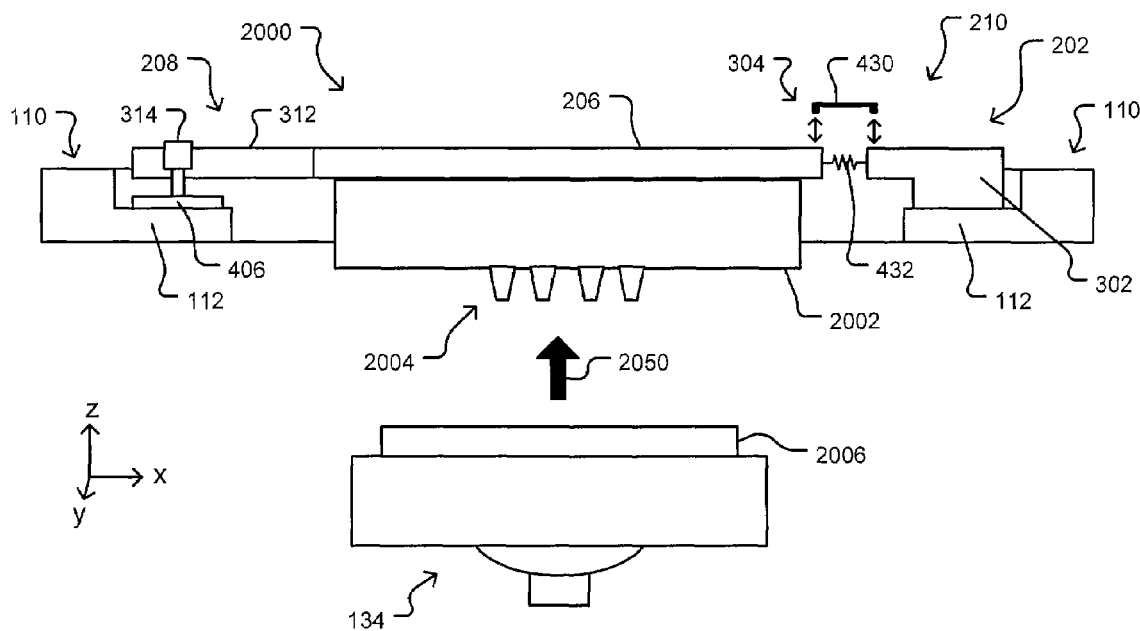
FIG. 20 illustrates a tool apparatus according to some embodiments of the invention.

Although many of the exemplary embodiments and configurations are described above in the context of a system for testing a DUT using a probe card assembly, many other embodiments of the invention are possible. FIG. 20 illustrates an example of such a system according to some embodiments of the invention. As shown, a tool apparatus 2000 can comprise the attachment/stiffening structure 202 with adjustment assemblies 208 and lockable compliant assemblies 210 of FIGS. 2-5 (including the exemplary configurations shown in FIGS. 6-18) or similar structures. As also shown, the tool apparatus 2000 can be attached to the insert ring 112 of the head plate 110 of the housing 132 (not shown in FIG. 20 but shown in FIG. 1) as described above with respect to FIGS. 1-18 or to a similar structure configured to receive the tool apparatus 2000. As shown in FIG. 20, a tool head assembly 2002 can be attached to the support structure 206, and the tool head assembly 2002 can comprise a plurality of tools 2004. A work piece 2006, which can be any object on which the tools 2004 of the tool head assembly 2002 are to perform an operation, can be disposed on the chuck 134 or a similar device, which as discussed above with regard to FIG. 1, can be enclosed in or attached to the housing 132 (not shown in FIG. 20 but shown in FIG. 1) of which the head plate 110 is a part. As discussed above, the chuck 134 can move the work piece 2006 into positions that allow the tools 2004 to operate on the work piece 2006. The tools 2004 can be, for example and without limitation, nozzles for spraying paint or other materials onto a surface of the work piece 2006. As another non-limiting example, the tools 2004 can be spindles or grinders configured to machine the work piece 2006.

The tool apparatus 2000 can be attached to the insert ring 112, and the lockable compliant assemblies 210 can be unlocked (which can be similar to 1904 of FIG. 19). The attitude of the support structure 206 (and thus the attitude of the tools 2004) can be adjusted using the adjustment assemblies 210 (which can be similar to 1906 of FIG. 19). While unlocked, the lockable compliant assemblies 210 can allow the support structure 206 to move relatively freely (at least in one or more degrees of freedom) with respect to the insert ring 112, and thus the unlocked lockable compliant assemblies 210 can exert little to no appreciable influence on the attitude of the support structure 206. The lockable compliant assemblies 210 can then be locked (which can be similar to 1908 of FIG. 19), and while locked, the lockable complaint assemblies 210 can provide additional stiffness (or mechanical resistance to movement) to the attachment/stiffness structure 202 to resist, for example, effects of loading 2050 (e.g., mechanical loading, thermally induced loading, etc.) on the tools 2004 or the tool head assembly 2002 while, for example, the tools 2004 operate on the work piece 2006.

Although specific embodiments and applications of the invention have been described in this specification, there is no intention that the invention be limited these exemplary embodiments and applications or to the manner in which the exemplary embodiments and applications operate or are described herein.

We claim:

1. A probe card assembly comprising:

a support structure;

a plurality of probes secured to the support structure, the probes comprising contact portions disposed to contact an electronic device disposed on a first side of the contact portions;

actuators configured to change selectively an attitude of the support structure with respect to a reference structure disposed on a second side of the contact portions, the second side being opposite the first side; and a plurality of lockable compliant structures, wherein:

while unlocked, the lockable compliant structures are compliant structures, allowing the support structure to move with respect to the reference structure, and while locked, the lockable compliant structures are non-compliant structures, mechanically resisting movement of the support structure with respect to the reference structure.

2. The probe card assembly of claim 1, wherein:

the support structure comprises a rigid plate-like structure;

the probe card assembly further comprises a plurality of rigid extensions extending from the support structure; and the actuators are disposed in the extensions.

3. The probe card assembly of claim 2, wherein the lockable compliant structures comprise arm assemblies attached to the support structure.

4. The probe card assembly of claim 1, wherein the probes are attached to a substrate, which is attached to the support structure.

5. The probe card assembly of claim 1, wherein the reference structure is part of a test apparatus in which the electronic device is disposed.

6. The probe card assembly of claim 5 further comprising a plurality of attachment mechanisms configured to attach the support structure to the reference structure.

7. The probe card assembly of claim 6, wherein each actuator is disposed to change selectively a distance between one of the attachment mechanisms and the reference structure.

8. The probe card assembly of claim 7, wherein the lockable compliant structures are configured to attach the support structure to the reference structure.

9. The probe card assembly of claim 7 further comprising three actuators.

10. The probe card assembly of claim 7, wherein each actuator comprises a differential screw assembly.

11. The probe card assembly of claim 1, wherein, while unlocked, the lockable compliant structures do not appreciably influence the attitude of the support structure with respect to the reference structure.

12. The probe card assembly of claim 1, wherein, while locked, each lockable compliant structure adds to a mechanical stiffness of the support structure.

13. The probe card assembly of claim 1 further comprising a plurality of rigid extensions extending laterally from the support structure, wherein ones of the actuators are disposed in ones of the extensions, and the probes are disposed below the support structure.

14. The probe card assembly of claim 13, wherein each of the lockable compliant structures comprises an arm assembly that extends laterally from the support structure.

15. The probe card assembly of claim 14, wherein:
the rigid extensions and the actuators are located entirely on the second side of the contact portions of the probes; and
the arm assemblies are located entirely on the second side of the contact portions of the probes.

16. The probe card assembly of claim 15, wherein each of the arm assemblies comprises an attachment portion configured to attach the probe card assembly to the reference structure.

17. The probe card assembly of claim 16, wherein each of the arm assemblies further comprises a compliant mechanism between the attachment portion and the support structure, the compliant mechanism allowing the support structure to move with respect to the attachment portion.

18. The probe card assembly of claim 17, wherein each of the arm assemblies further comprises a locking mechanism that, while locked impedes movement of the support structure with respect to the attachment portion.

19. The probe card assembly of claim 13, wherein the rigid extensions and the actuators are located entirely on the second side of the contact portions of the probes.

20. A probe card assembly comprising:
a support structure;
a plurality of probes secured to the support structure and disposed to contact an electronic device to be tested;
actuators configured to change selectively an attitude of the support structure with respect to a reference structure; and
a plurality of lockable compliant structures, wherein:
while unlocked, the lockable compliant structures allow the support structure to move with respect to the reference structure, and
while locked, the compliant structures mechanically resist movement of the support structure with respect to the reference structure, and
wherein each lockable compliant structure comprises:
an attachment block configured to be attached to the reference structure;
an end block moveably connected to the support structure; and
an interconnector block movably connected to the attachment block and moveably connected to the end block.

21. The probe card assembly of claim 20, wherein each lockable compliant structure further comprises clutches configured, while locked, to prevent the support structure from moving with respect to the end block and prevent the interconnector block from moving with respect to the end block and the attachment block.

22. A probe card assembly comprising:
a support structure;
a plurality of probes secured to the support structure and disposed to contact an electronic device to be tested;
actuators configured to change selectively an attitude of the support structure with respect to a reference structure; and
a plurality of lockable compliant structures, wherein:
while unlocked, the lockable compliant structures allow the support structure to move with respect to the reference structure, and
while locked, the compliant structures mechanically resist movement of the support structure with respect to the reference structure, and
wherein each lockable compliant structure comprises:
a first sphere rotatably disposed in a first clutch structure that is attached to the support structure;
a second sphere rotatably disposed in a second clutch structure configured to be attached to the reference structure; and
a bar disposed between the first sphere and the second sphere.

23. The probe card assembly of claim 22, wherein locking the first clutch prevents the first sphere from rotating, and locking the second clutch prevents the second sphere from rotating.

24. An apparatus for adjusting an attitude of a plurality of probes, the apparatus comprising:
a support structure to which the probes are secured, the probes comprising contact portions disposed to contact an electronic device disposed on a first side of the contact portions;
an adjustment mechanism configured to adjust an attitude of the support structure with respect to a reference structure disposed on a second side of the contact portions, the second side being opposite the first side; and
a clutched compliant mechanism configured to:
while a clutch of the clutched compliant mechanism is disengaged, the clutched compliant mechanism is a compliant structure, allowing the support structure to move with respect to the reference structure, and
while the clutch of the clutched compliant mechanism is engaged, the clutched compliant mechanism is a non-compliant structure, mechanically resisting movement of the support structure with respect to the reference structure.

25. The apparatus of claim 24, wherein the probes are configured to contact terminals of the electronic device, and the reference structure is part of a test apparatus in which the electronic device is disposed during testing of the electronic device.

26. The apparatus of claim 24 further comprising a plurality of attachment mechanisms configured to attach the support structure to the reference structure.

27. The apparatus of claim 26, wherein the adjustment mechanism comprises a plurality of actuators, each actuator is disposed to change selectively an orientation of the support structure with respect to one of the attachment mechanisms.

28. The apparatus of claim 27, wherein each actuator comprises a differential screw assembly.

29. The apparatus of claim 24, wherein the clutched compliant mechanism is configured to attach the support structure to the reference structure.

30. The apparatus of claim 24, wherein the clutched compliant mechanism allows at least four degrees of movement of the support structure with respect to the reference structure.

31. The apparatus of claim 30, wherein the four degrees of movement include rotation about three perpendicular axes and translation along at least one of the axes.

32. The apparatus of claim 24, wherein, while the clutch of the clutched compliant mechanism is disengaged, the clutched compliant mechanism does not appreciably influence the attitude of the support structure with respect to the reference structure.

33. The apparatus of claim 24, wherein, while engaged, the clutched compliant mechanism adds to a mechanical stiffness of the support structure.

34. The apparatus of claim 24, wherein each clutched compliant mechanism comprises:
   an attachment structure configured to be attached to the reference structure;
   an end structure attached to the support structure; and
   an interconnector structure moveably connected to the attachment structure and moveably connected to the end structure.

35. The apparatus of claim 34, wherein the end structure is moveably attached to the support structure.

36. The apparatus of claim 35, wherein each clutched compliant structure further comprises clutches configured, while locked, to prevent the support structure from moving with respect to the end structure and prevent the interconnector structure from moving with respect to the end structure and the attachment structure.

37. The apparatus of claim 34, wherein
   the interconnector structure comprises a bar with a first ball end and a second ball end;
   the attachment structure comprises a first clutch in which the first ball end is disposed and can rotate while the first clutch is unlocked; and
   the end structure comprises a second clutch in which the second ball end is disposed and can rotate while the second clutch is unlocked.

38. The probe card assembly of claim 37, wherein:
   while the first clutch is locked, the first clutch impedes the first ball end from rotating; and
   while the second clutch is locked, the second clutch impedes the second ball end from rotating.

* * * * *